United States Patent
Jogo et al.

(10) Patent No.: US 7,428,130 B2
(45) Date of Patent: Sep. 23, 2008

(54) MAGNETORESISTIVE ELEMENT, MAGNETIC HEAD, MAGNETIC STORAGE UNIT, AND MAGNETIC MEMORY UNIT

(75) Inventors: Arata Jogo, Kawasaki (JP); Hirotaka Oshima, Kawasaki (JP); Takahiro Ibusuki, Kawasaki (JP); Yutaka Shimizu, Kawasaki (JP); Takuya Uzumaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 386 days.

(21) Appl. No.: 11/410,315

(22) Filed: Apr. 25, 2006

(65) Prior Publication Data

US 2007/0268632 A1 Nov. 22, 2007

(30) Foreign Application Priority Data

Nov. 30, 2005 (JP) ............................. 2005-346065
Mar. 8, 2006 (JP) ............................. 2006-062944

(51) Int. Cl.
*G11B 5/39* (2006.01)
(52) U.S. Cl. .............................................. 360/324.12
(58) Field of Classification Search .............. 360/324.1, 360/324.12; 257/200, 421; 428/611
See application file for complete search history.

(56) References Cited

U.S. PATENT DOCUMENTS 6,905,780 B2 * 6/2005 Yuasa et al. ................. 428/611
7,071,522 B2 * 7/2006 Yuasa et al. ................. 257/421
2003/0168673 A1 * 9/2003 Yuasa et al. ................. 257/200
2007/0121255 A1 * 5/2007 Tsuchiya et al. ......... 360/324.1

FOREIGN PATENT DOCUMENTS

JP 2003-218428 7/2003

* cited by examiner

*Primary Examiner*—Tianjie Chen
(74) *Attorney, Agent, or Firm*—Westerman, Hattori, Daniels & Adrian, LLP.

(57) ABSTRACT

A CPP-type magnetoresistive element including a fixed magnetization layer, a non-magnetic metal layer, and a free magnetization layer that are stacked, and a diffusion prevention layer is disclosed. The free magnetization layer includes CoMnAl. The diffusion prevention layer is provided between the non-magnetic metal layer and the free magnetization layer so as to prevent Mn included in the free magnetization layer from diffusing into the non-magnetic metal layer. CoMnAl has a composition within the area formed by connecting Point A (44, 23, 33), Point B (48, 25, 27), Point C (60, 20, 20), Point D (65, 15, 20), Point E (65, 10, 25), Point F (60, 10, 30), and Point A with straight lines in this order in a ternary composition diagram where coordinates of the composition are expressed as (Co content, Mn content, Al content) with each of the Co, Mn, and Al contents being expressed in atomic percentage.

20 Claims, 20 Drawing Sheets

FIG.7

| SAMPLE NO. | Co (at.%) | Mn (at.%) | Al (at.%) | COERCIVE FORCE (Oe) |
|---|---|---|---|---|
| 1 | 75.0 | 10.0 | 15.0 | 17.0 |
| 2 | 70.0 | 15.0 | 15.0 | 11.0 |
| 3 | 65.0 | 20.0 | 15.0 | 24.0 |
| 4 | 60.0 | 25.0 | 15.0 | 17.0 |
| 5 | 56.7 | 28.3 | 15.0 | 23.0 |
| 6 | 70.0 | 10.0 | 20.0 | 14.0 |
| 7 | 65.0 | 15.0 | 20.0 | 8.9 |
| 8 | 60.0 | 20.0 | 20.0 | 7.0 |
| 9 | 53.3 | 26.7 | 20.0 | 56.0 |
| 10 | 65.0 | 10.0 | 25.0 | 10.0 |
| 11 | 60.0 | 15.0 | 25.0 | 6.0 |
| 12 | 55.0 | 20.0 | 25.0 | 10.0 |
| 13 | 50.0 | 25.0 | 25.0 | 11.5 |
| 14 | 60.0 | 10.0 | 30.0 | 10.0 |
| 15 | 55.0 | 15.0 | 30.0 | 7.0 |
| 16 | 50.0 | 20.0 | 30.0 | 8.4 |
| 17 | 46.7 | 23.3 | 30.0 | 4.2 |
| 18 | 45.0 | 22.5 | 32.5 | 1.5 |
| 19 | 43.3 | 21.7 | 35.0 | 1.7 |
| 20 | 41.3 | 20.7 | 38.0 | 2.6 |

MAGNETORESISTIVE ELEMENT, MAGNETIC HEAD, MAGNETIC STORAGE UNIT, AND MAGNETIC MEMORY UNIT

CROSS-REFERENCE TO RELATED APPLICATION

The present application is based on Japanese Priority Patent Applications No. 2005-346065, filed on Nov. 30, 2005, and No. 2006-062944, filed on Mar. 8, 2006, the entire contents of which are hereby incorporated by reference.

BACKGROUND OF THE INVENTION

1. Field of the Invention

The present invention relates generally to magnetoresistive elements and magnetic heads for reproducing information in a magnetic storage unit, magnetic storage units, and magnetic memory units, and more particularly to a magnetoresistive element having a CPP (Current-Perpendicular-to-Plane) structure where sense current is caused to flow in the stacking direction of the stacked films forming the magnetoresistive element.

2. Description of the Related Art

In recent years, in the magnetic head of a magnetic storage unit, a magnetoresistive element has been employed as a reproduction element for reproducing information recorded in a magnetic recording medium. The magnetoresistive element reproduces information recorded in the magnetic recording medium using the magnetoresistance effect converting a change in the direction of a signal magnetic field leaking out from the magnetic recording medium into a change in electric resistance.

With the increase in the recording density of the magnetic storage unit, magnetoresistive elements with a spin-valve film have become mainstream. The spin-valve film includes a fixed magnetization layer in which magnetization is fixed in a predetermined direction, a non-magnetic layer, and a free magnetization layer in which the direction of magnetization changes in accordance with the direction and the strength of a leakage magnetic field from a magnetic recording medium. The electric resistance of the spin-valve film changes in accordance with the angle formed by the magnetization of the fixed magnetization layer and the magnetization of the free magnetization layer. The magnetoresistive element reproduces bits recorded in the magnetic recording medium by detecting a change in the electric resistance as a change in voltage by causing a sense current of a fixed value to flow through the spin-valve film.

Conventionally, a CIP (Current-In-Plane) structure where sense current is caused to flow in the in-plane direction of a spin-valve film has been employed for the magnetoresistive element. In order to further increase the recording density of the magnetic recording unit, it is necessary in the magnetic recording medium to increase its track recording density and track density. On the other hand, in the magnetoresistive element, it is necessary to reduce both element width corresponding to the track width of the magnetic recording medium and element height (the depth of the element), that is, the element cross section. In this case, in the CIP structure, the current density of sense current increases so that the degradation of performance may be caused because of the migration of a material forming the spin-valve film due to overheating.

Therefore, a CPP structure where sense current is caused to flow in the stacking direction of the spin-valve film, that is, the direction in which the fixed magnetization layer, the non-magnetic layer, and the free magnetization layer are stacked, has been proposed and studied eagerly as a next-generation reproduction element. The CPP-type spin-valve film, which has the merit that narrowing element width hardly changes output, is suitable for increasing recording density.

The output of the CPP-type spin-valve film is determined by a change in magnetoresistance at the time of applying an external magnetic field to the spin-valve film by a magnetic field sweep from one direction to the opposite direction. This change in magnetoresistance is the magnetoresistance change of the unit area of the film surface perpendicular to the direction of the sense current. The magnetoresistance change of the unit area is the product of the magnetoresistance change of the spin-valve film and the film surface of the spin-valve film. In order to increase the magnetoresistance change of the unit area, a material whose product of a spin-dependent bulk scattering coefficient and specific resistance is large should be used for the free magnetization layer and the fixed magnetization layer. The spin-dependent bulk scattering coefficient indicates the degree to which conduction electrons scatter inside the free magnetization layer or the fixed magnetization layer depending on the spin orientations of the conduction electrons. The greater the spin-dependent bulk scattering coefficient, the greater the magnetoresistance change.

For example, Japanese Laid-Open Patent Application No. 2003-218428 (hereinafter, JP2003-218428) proposes a magnetoresistive element using, as a material of a large spin-dependent bulk scattering coefficient, a soft magnetic alloy of a Heusler alloy composition for the free magnetization layer.

However, in the case of using $Co_2MnAl$ of a Heusler alloy composition for the free magnetization layer as in JP2003-218428 described above, its high coercive force slows the response of the magnetization of the free magnetization layer to the signal magnetic field from a magnetic recording medium. That is, the sensitivity of the magnetoresistive element is reduced. There is a general tendency for the signal magnetic field strength from a magnetic recording medium to decrease as the recording density increases. Accordingly, if the coercive force of the free magnetization layer is high, the electric resistance due to the magnetoresistance effect may not be saturated. This reduces a substantial change in magnetoresistance, thus decreasing the output of the magnetoresistive element. Further, if the coercive force is too high, the magnetization of the free magnetization layer hardly rotates because of the signal magnetic field, so that little output may be obtained.

SUMMARY OF THE INVENTION

According to one embodiment of the present invention, there is provided a magnetoresistive element in which the above-described disadvantage is eliminated.

According to one embodiment of the present invention, there is provided a high-output magnetoresistive element having good sensitivity for detecting a magnetic field.

According to one embodiment of the present invention, there is provided a magnetic head, a magnetic storage unit, and a magnetic memory unit using the magnetoresistive element.

According to one embodiment of the present invention, there is provided a magnetoresistive element of a CPP type including a fixed magnetization layer, a non-magnetic metal layer, and a free magnetization layer that are stacked, and a diffusion prevention layer, wherein: the free magnetization layer includes CoMnAl; the diffusion prevention layer is provided between the non-magnetic metal layer and the free magnetization layer so as to prevent Mn included in the free magnetization layer from diffusing into the non-magnetic metal layer; and CoMnAl has a composition within an area formed by connecting Point A (44, 23, 33), Point B (48, 25, 27), Point C (60, 20, 20), Point D (65, 15, 20), Point E (65, 10, 25), Point F (60, 10, 30), and Point A with straight lines in this order in a ternary composition diagram where coordinates of the composition are expressed as (Co content, Mn content, Al content) with each of the Co content, the Mn content, and the Al content being expressed in atomic percentage.

According to one aspect of the present invention, CoMnAl is employed for the free magnetization layer of a CPP magnetoresistive element. CoMnAl has a relatively large spin-dependent bulk scattering coefficient substantially equal to that of CoFe, which is conventionally employed as the material of the free magnetization layer. Further, the specific resistance of CoMnAl is extremely greater than the specific resistance of CoFe. Accordingly, employment of CoMnAl for the free magnetization layer and/or a fixed magnetization layer makes the magnetoresistance change depending on the product of the spin-dependent bulk scattering coefficient and the specific resistance extremely greater than that in the case of employing CoFe. As a result, it is possible to significantly increase the output of the magnetoresistive element. Further, according to one aspect of the present invention, a diffusion prevention layer to prevent Mn included in the free magnetization layer from diffusing into a non-magnetic metal layer is provided between the non-magnetic metal layer and the free magnetization layer. Existence of Mn in the non-magnetic metal layer will cause the fixed magnetization layer and the free magnetization layer to be coupled magnetically with the same magnetization direction, so that the magnetization of the fixed magnetization layer and the magnetization of the free magnetization layer may move at the same angle to an external magnetic field. Provision of the diffusion prevention layer prevents diffusion of Mn into the non-magnetic metal layer, thereby preventing degradation of $\Delta RA$, which is caused by diffusion of Mn into the non-magnetic metal layer.

Further, the studies by the inventors of the present invention have found that selecting the composition of CoMnAl of the free magnetization layer from those within the above described area ABCDEFA makes it possible to make the coercive force of the free magnetization layer lower than that in the case of the Heusler alloy composition of $Co_{50}Mn_{25}Al_{25}$.

As a result of these, the sensitivity to a signal magnetic field from a magnetic recording medium increases, so that it is possible to cope with reduction in the signal magnetic field from the magnetic recording medium due to high recording density. Therefore, according to the present invention, it is possible to achieve a high-output magnetoresistive element having good sensitivity for detecting a magnetic field. The CPP type refers to the method by which sense current is caused to flow in a direction perpendicular to the film surface of a magnetoresistive film, that is, in the stacking direction of the layers of the magnetoresistive film.

According to one embodiment of the present invention, there is provided a magnetoresistive element of a CPP type including a fixed magnetization layer, a non-magnetic insulating layer, and a free magnetization layer that are stacked, wherein: the free magnetization layer includes CoMnAl; and CoMnAl has a composition within an area formed by connecting Point A (44, 23, 33), Point B (48, 25, 27), Point C (60, 20, 20), Point D (65, 15, 20), Point E (65, 10, 25), Point F (60, 10, 30), and Point A with straight lines in this order in a ternary composition diagram where coordinates of the composition are expressed as (Co content, Mn content, Al content) with each of the Co content, the Mn content, and the Al content being expressed in atomic percentage.

According to one aspect of the present invention, by employing CoMnAl of the above-described composition range for the free magnetization layer, it is also possible to achieve a high-output magnetoresistive element having good sensitivity to a signal magnetic field in the case where a magnetoresistive element includes a so-called tunneling magnetoresistive film.

According to one embodiment of the present invention, there is provided a magnetic head including one of the above-described magnetoresistive elements.

According to one aspect of the present invention, since a magnetoresistive element produces high output and has good sensitivity to a signal magnetic field, it is possible to achieve a magnetic head capable of supporting recording and reproduction with high recording density.

According to one embodiment of the present invention, there is provided a magnetic storage unit including a magnetic head having one of the above-described magnetoresistive elements; and a magnetic recording medium.

According to one aspect of the present invention, since a magnetoresistive element produces high output and has good sensitivity to a signal magnetic field from a magnetic recording medium, it is possible to provide a magnetic storage unit with high recording density.

According to one embodiment of the present invention, there is provided a magnetic memory unit including: a magnetoresistive film of a CPP type including a fixed magnetization layer, a non-magnetic metal layer, and a free magnetization layer that are stacked, and a diffusion prevention layer; a write part configured to orient magnetization of the free magnetization layer in a predetermined direction by applying a magnetic field to the magnetoresistive film; and a read part configured to detect resistance by supplying a sense current to the magnetoresistive film, wherein the free magnetization layer includes CoMnAl; the diffusion prevention layer is provided between the non-magnetic metal layer and the free magnetization layer so as to prevent Mn included in the free magnetization layer from diffusing into the non-magnetic metal layer; and CoMnAl has a composition within an area formed by connecting a first point (44, 23, 33), a second point (48, 25, 27), a third point (60, 20, 20), a fourth point (65, 15, 20), a fifth point (65, 10, 25), a sixth point (60, 10, 30), and the first point with straight lines in this order in a ternary composition diagram where coordinates of the composition are expressed as (Co content, Mn content, Al content) with each of the Co content, the Mn content, and the Al content being expressed in atomic percentage.

According to one aspect of the present invention, CoMnAl is employed for a free magnetization layer in a magnetic memory unit. Therefore, the magnetoresistance change depending on the product of the spin-dependent bulk scattering coefficient and the specific resistance is extremely greater than that in the case of employing CoFe. Accordingly, there is a great difference between the magnetoresistance values corresponding to retained "0" and "1," respectively, so that the magnetic memory unit is capable of performing reading with accuracy at the time of reading out information. Further, a diffusion prevention layer to prevent Mn contained in the free magnetization layer from diffusing into a non-magnetic metal layer is provided between the non-magnetic metal layer and the free magnetization layer. The diffusion prevention layer makes it possible to prevent Mn diffusion into the non-magnetic metal layer due to temperature increase caused by heat treatment in the manufacturing process of a magnetic memory unit or by heat generation during use of the magnetic memory unit. Therefore, the magnetic memory unit has good heat resistance and can prevent degradation of the magnetoresistance change.

According to one embodiment of the present invention, there is provided a magnetic memory unit including: a magnetoresistive film of a CPP type including a fixed magnetization layer, a non-magnetic insulating layer, and a free magnetization layer that are stacked; a write part configured to orient magnetization of the free magnetization layer in a predetermined direction by applying a magnetic field to the magnetoresistive film; and a read part configured to detect resistance by supplying a sense current to the magnetoresistive film, wherein the free magnetization layer includes CoMnAl; and CoMnAl has a composition within an area formed by connecting a first point (44, 23, 33), a second point (48, 25, 27), a third point (60, 20, 20), a fourth point (65, 15, 20), a fifth point (65, 10, 25), a sixth point (60, 10, 30), and the first point with straight lines in this order in a ternary composition diagram where coordinates of the composition are expressed as (Co content, Mn content, Al content) with each of the Co content, the Mn content, and the Al content being expressed in atomic percentage.

According to one aspect of the present invention, even in the case where the magnetoresistive film is a tunneling magnetoresistive film, it is possible to realize a magnetic memory unit capable of performing reading with accuracy by using CoMnAl of the above-described composition range for a free magnetization layer.

Thus, according to one aspect of the present invention, it is possible to achieve a high-output magnetoresistive element with good sensitivity for detecting a magnetic field, and a magnetic head, a magnetic storage unit, and a magnetic memory unit using the same.

BRIEF DESCRIPTION OF THE DRAWINGS

Other objects, features and advantages of the present invention will become more apparent from the following detailed description when read in conjunction with the accompanying drawings, in which:

FIG. 7 shows the relationship between the composition and coercive force of the free magnetization layer of an example implementation according to the first embodiment of the present invention;

DETAILED DESCRIPTION OF THE PREFERRED EMBODIMENTS

A description is given, with reference to the accompanying drawings, of embodiments of the present invention. For convenience of description, the magnetoresistance change of a unit area ΔRA is abbreviated as "magnetoresistance change ΔRA" or simply "ΔRA" unless otherwise noted.

First Embodiment

A description is given of a composite magnetic head including a magnetoresistive element and an induction-type recording element according to a first embodiment of the present invention.

Figure 1:
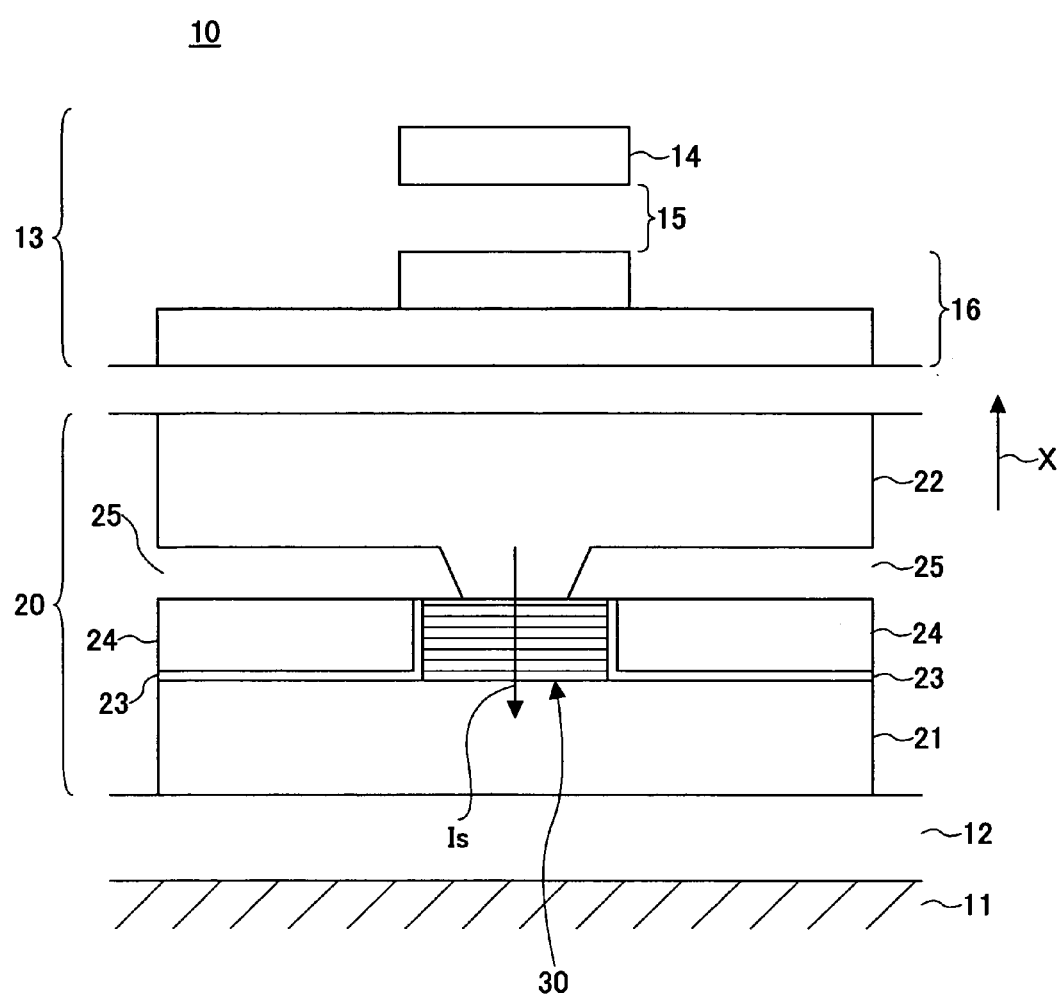
FIG. 1 is a diagram showing part of the medium opposing surface of a composite magnetic head according to a first embodiment of the present invention.

FIG. 1 is a diagram showing part of the medium opposing surface of a composite magnetic head 10 according to the first embodiment. In FIG. 1, the direction of the arrow X indicates the direction of movement of a magnetic recording medium (not graphically illustrated) opposing a magnetoresistive element 20.

Referring to FIG. 1, the magnetic head 10 includes the magnetoresistive element 20 formed on a flat ceramic substrate 11 of $Al_2O_3$—TiC or the like serving as the base body of a head slider, and an induction-type recording element 13 formed thereon.

The induction-type recording element 13 includes an upper magnetic pole 14, a lower magnetic pole 16, a yoke (not graphically illustrated) connecting the upper magnetic pole 14 and the lower magnetic pole 16 magnetically, and a coil (not graphically illustrated) wound around the yoke to induce a recording magnetic field with recording current. The upper magnetic pole 14 has a width corresponding to the track width of a magnetic recording medium on the medium opposing surface. The lower magnetic pole 16 opposes the upper magnetic pole 14 across a recording gap layer 15 formed on a non-magnetic material. Each of the upper magnetic pole 14, the lower magnetic pole 16, and the yoke is formed of a soft magnetic material. In order to ensure a recording magnetic field, this soft magnetic material may be a material having a high saturation flux density, such as $Ni_{80}Fe_{20}$, CoZrNb, FeN, FeSiN, FeCo, or CoNiFe. The induction-type recording element 13 is not limited to this configuration, and an induction-type recording element of a known structure may be employed.

The magnetoresistive element 20 includes a lower electrode 21, a magnetoresistive film 30 (hereinafter referred to as "GMR film 30"), an alumina film 25, and an upper electrode 22 stacked on an alumina film 12 formed on the surface of the ceramic substrate 11. The GMR film 30 is electrically connected to each of the lower electrode 21 and the upper electrode 22.

A magnetic domain control film 24 is provided on each side of the GMR film 30 with an insulating film 23 provided therebetween. The magnetic domain control film 24 is formed of a layered body of, for example, a Cr film and a ferromagnetic CoCrPt film. The magnetic domain control film 24 converts a free magnetization layer 39 (FIG. 2) forming the GMR film 30 into a single magnetic domain, and prevents generation of Barkhausen noise.

The lower electrode 21 and the upper electrode 22 function as a magnetic shield as well as the channel of a sense current Is. Therefore, each of the lower electrode 21 and the upper electrode 22 is formed of a soft magnetic alloy such as NiFe or CoFe. Further, a conductive film such as a Cu film, Ta film, or Ti film may be provided at the interface of the lower electrode 21 and the GMR film 30. The conductive film improves the crystallinity of each layer of the GMR film 30.

Further, each of the magnetoresistive element 20 and the induction-type recording element 13 is covered with an alumina film or a carbon hydride film in order to prevent corrosion.

The sense current Is flows, for example, from the upper electrode 22 to go through the GMR film 30 in a direction substantially perpendicular to its film surface (the stacking direction of the GMR film 30) so as to reach the lower electrode 21. The electric resistance, or so-called magnetoresistance, of the GMR film 30 changes in accordance with the strength and the direction of a signal magnetic field leaking out from the magnetic recording medium. The magnetoresistive element 20 causes the sense current Is of predetermined amperage to flow through the GMR film 30, and detects a change in the magnetoresistance of the GMR film 30 as a voltage change. In this manner, the magnetoresistive element 20 reproduces information recorded in the magnetic recording medium. The direction in which the sense current Is flows is not limited to the direction shown in FIG. 1, and may be reversed. Further, the direction of movement of the magnetic recording medium may also be reversed.

As the method of forming the recording element 13 and the magnetoresistive element 20 of the magnetic head 10, for example, a film formation method such as sputtering, vacuum evaporation, or chemical vapor deposition, and a patterning method combining photolithography and dry etching are employable.

Further, the composite magnetic head 10 is shown as one embodiment of the present invention, while as another embodiment of the present invention, the magnetic head may be a read-only magnetic head including only the magnetoresistive element 20 according to the first embodiment (or a magnetoresistive element according to a below-described second embodiment).

Next, a description is given of five examples (first through fifth examples) with respect to the configuration of the GMR film 30 forming the magnetoresistive element 20. Any of the GMR films of the first through fifth examples may be applied to the magnetoresistive element 20.

Figure 2:
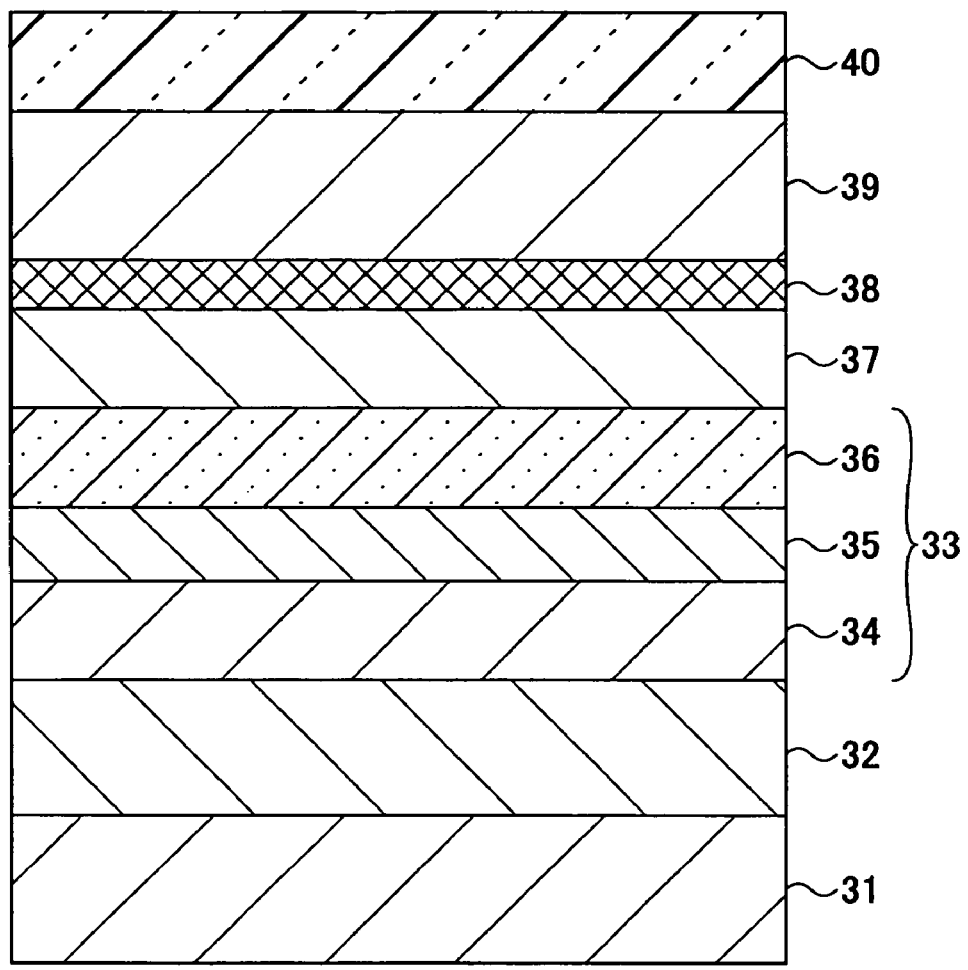
FIG. 2 is a cross-sectional view of a first example GMR film forming a magnetoresistive element according to the first embodiment of the present invention.

FIG. 2 is a cross-sectional view of the GMR film 30, the GMR film of the first example, forming the magnetoresistive element 20 according to the first embodiment.

Referring to FIG. 2, the GMR film 30 of the first example includes an underlayer 31, an antiferromagnetic layer 32, a fixed magnetization layered body 33, a non-magnetic metal layer 37, a diffusion prevention layer 38, the free magnetization layer 39, and a protection layer 40, which are stacked successively. The GMR film 30 has a so-called single spin-valve structure.

The underlayer 31 is formed on the surface of the lower electrode 21 shown in FIG. 1 by sputtering. The underlayer 31 is formed of, for example, a NiCr film or a layered body of a Ta film (for example, 5 nm in film thickness) and a NiFe film (for example, 5 nm in film thickness). Preferably, the Fe content of the NiFe film falls within the range of 17 at. % to 25 at. %. Employment of a NiFe film of such a composition causes the antiferromagnetic layer 32 to grow epitaxially on a crystal surface of (111), which is the crystal growth direction of the NiFe film, and the surface of a crystal surface crystallographically equivalent thereto. As a result, it is possible to improve the crystallinity of the antiferromagnetic layer 32, and further, the crystallinity of the free magnetization layer 39 improves through the layers 34 through 38 stacked on the antiferromagnetic layer 32 so that it is possible to reduce the coercive force of the free magnetization layer 39.

The antiferromagnetic layer 32 is formed of, for example, a Mn-TM alloy of 4 nm to 30 nm (preferably, 4 nm to 10 nm) in film thickness, where TM is at least one selected from Pt, Pd, Ni, Ir, and Rh. Examples of the Mn-TM alloy include PtMn, PdMn, NiMn, IrMn, and PtPdMn. The antiferromagnetic layer 32 fixes the magnetization of a first fixed magnetization layer 34 of the fixed magnetization layered body 33 in a predetermined orientation through the exchange interaction with the first fixed magnetization layer 34.

The fixed magnetization layered body 33 is formed by stacking the first fixed magnetization layer 34, a non-magnetic coupling layer 35, and a second fixed magnetization layer 36 in order from the antiferromagnetic layer 32 side. The fixed magnetization layered body 33 has a so-called synthetic ferrimagnetic structure where the magnetization of the first fixed magnetization layer 34 and the magnetization of the second fixed magnetization layer 36 are antiferromagnetically coupled by exchange coupling so that the orientations of their magnetizations are antiparallel to each other.

Each of the first and second fixed magnetization layers 34 and 36 is formed of a ferromagnetic material of 1-30 nm in film thickness containing at least one of Co, Ni, and Fe. The examples of the ferromagnetic material include CoFe, CoFeB, CoFeAl, NiFe, FeCoCu, and CoNiFe.

As the second fixed magnetization layer 36, a ferromagnetic material expressed by the general formula CoFeZ (where Z is at least one element selected from Al, Si, Ga, Ge, Cu, Mg, V, Cr, In, Sn, B, and Ni) and forming the crystal structure of a Heusler alloy with a composition of $Co_{50}Fe_{25}Z_{25}$ (in which each content is expressed in at. %) may also be employed. The CoFeZ ferromagnetic material has a large spin-dependent bulk scattering coefficient so as to be able to increase ΔRA of the magnetoresistive element 20. The second fixed magnetization layer 36 does not have an adverse effect on the properties of the magnetoresistive element 20 even if the second fixed magnetization layer 36 has a high coercive force. Accordingly, the second fixed magnetization layer 36 can be selected from a composition range of large spin-dependent bulk scattering coefficients.

Ferromagnetic materials suitable in particular for the second fixed magnetization layer 36 include CoMnAl. The spin-dependent bulk scattering coefficient of CoMnAl is substantially equal to the spin-dependent bulk scattering coefficient of CoFe, and is relatively greater than those of the other soft magnetic materials. Further, CoMnAl has a greater specific resistance than CoFe. Employing CoMnAl for the second fixed magnetization layer 36 based on these aspects makes it possible to significantly increase the magnetoresistance change ΔRA.

Further, ferromagnetic materials such as $Co_{60}Fe_{40}$ and NiFe are suitable for the first fixed magnetization layer 34 in that their specific resistance is low. The orientation of the magnetization of the first fixed magnetization layer 34 is reverse to the orientation of the magnetization of the second fixed magnetization layer 36. Accordingly, if the spin-dependent bulk scattering coefficient of the first fixed magnetization layer 34 has the same sign as that of the second fixed magnetization layer 36, the first fixed magnetization layer 34 acts in a direction to reduce the magnetoresistance change ΔRA. In this case, it is possible to control the reduction in the magnetoresistance change ΔRA by employing a ferromagnetic material of low specific resistance.

The film thickness of the non-magnetic coupling layer 35 is set to fall within such a range as to allow the first fixed magnetization layer 34 and the second fixed magnetization layer 36 to be exchange-coupled antiferromagnetically. The range is 0.4 nm to 1.5 nm (preferably, 0.4 nm to 0.9 nm). The non-magnetic coupling layer 35 is formed of a non-magnetic material such as Ru, Rh, Ir, a Ru-based alloy, a Rh-based alloy, or an Ir-based alloy. A non-magnetic material containing Ru and one of Co, Cr, Fe, Ni, and Mn or an alloy thereof is suitable as the Ru-based alloy.

Each of the first and second fixed magnetization layers 34 and 36 may be formed of not only a single layer but also a layered body of multiple layers. The layers of the layered body may employ respective materials equal in element combination but different from each other in composition ratio. Alternatively, the layers may employ respective materials different from each other in element combination.

Further, a ferromagnetic joining layer formed of a ferromagnetic material higher in saturation flux density than the first fixed magnetization layer 34, although its graphical illustration is omitted, may be provided between the first fixed magnetization layer 34 and the antiferromagnetic layer 32. This makes it possible to increase the exchange interaction between the first fixed magnetization layer 34 and the antiferromagnetic layer 32. As a result, it is possible to avoid the problem that the orientation of the magnetization of the first fixed magnetization layer 34 is displaced or reversed from a predetermined orientation.

The non-magnetic metal layer 37 is formed of, for example, a non-magnetic conductive material of 1.5 nm to 10 nm in film thickness. Conductive materials suitable for the non-magnetic metal layer 37 include Cu, Al, and Cr.

The diffusion prevention layer 38 may be formed of, for example, a ferromagnetic material of 0.2 nm to 2 nm in film thickness that contains at least one element selected from the group consisting of Co, Fe, and Ni and does not contain Mn. The diffusion prevention layer 38 prevents Mn in CoMnAl of the below-described free magnetization layer 39 from diffusing into the non-magnetic metal layer 37. If Mn diffuses into the non-magnetic metal layer 37, the second fixed magnetization layer 36 and the free magnetization layer 39 have the same magnetization direction to be coupled magnetically. As a result, their magnetizations move at the same angle to an external magnetic field, thereby degrading ΔRA. However, provision of the diffusion prevention layer 38 prevents diffusion of Mn, and accordingly, avoids degradation of ΔRA.

The diffusion prevention layer 38 may be, for example, CoFe, NiFe, CoNiFe, alloys of CoFe and a non-magnetic element (such as CoFeB and CoFeCu), alloys of NiFe and a non-magnetic element (such as NiFeB and NiFeCu), and alloys of CoNiFe and a non-magnetic element (such as CoNiFeB and CoNiFeCu). By forming the diffusion prevention layer 38 of a ferromagnetic material, it is possible to further improve ΔRA of the magnetoresistive element 20. It is preferable to employ CoFe, which has a relatively large spin-dependent interface scattering coefficient, for the diffusion prevention layer 38.

Further, it is particularly preferable to employ CoNiFe for the diffusion prevention layer 38. The spin-dependent interface scattering coefficient of CoNiFe is greater than that of CoFe, and by setting the film thickness of the diffusion prevention layer 38 to a predetermined value, the coercive force of the layered body integrating the free magnetization layer 39 and the diffusion prevention layer 38 is reduced compared with that of the free magnetization layer 39 alone. Accordingly, it is possible to increase sensitivity to a magnetic field. It is preferable that the film thickness of CoNiFe be within the range of 0.5 nm to 2.0 nm. It is preferable that the film thickness of CoNiFe be greater because as the film thickness increases, spin-dependent bulk scattering increases. However, if the film thickness exceeds 2.0 nm, the coercive force of CoNiFe alone increases so that the coercive force of the layered body of the free magnetization layer 39 and the diffusion prevention layer 38 increases.

Further, the diffusion prevention layer 38 may be formed of, for example, a non-magnetic material of 0.2 nm to 2 nm in film thickness containing at least one element selected from the group consisting of Ti, Ta, W, Au, Pt, Mo, and Hf. Such a non-magnetic material can also prevent Mn included in the free magnetization layer 39 from diffusing into the non-magnetic metal layer 37.

The free magnetic layer 39 is formed of, for example, CoMnAl of 2 nm to 10 nm in film thickness. CoMnAl has substantially the same spin-dependent bulk scattering coefficient as CoFe, and has an extremely greater specific resistance than CoFe. Therefore, the magnetoresistance change ΔRA is extremely great compared with the case of employing CoFe for the free magnetic layer 39.

Further, it is desirable that the magnetization of the free magnetization layer 39 be responsive to a signal magnetic field applied externally. Therefore, the smaller the coercive force of the free magnetization layer 39, the better. In terms of low coercive force, CoMnAl forming the free magnetization layer 39 has its composition set within the area (composition range) formed by connecting Point A (44, 23, 33), Point B (48, 25, 27), Point C (60, 20, 20), Point D (65, 15, 20), Point E (65, 10, 25), Point F (60, 10, 30), and Point A with straight lines in this order in a ternary composition diagram of CoMnAl shown in FIG. 8, where the coordinates of each composition are expressed as (Co content, Mn content, Al content). In this composition range, the coercive force is reduced with respect to $Co_{50}Mn_{25}Al_{25}$, which is the Heusler alloy composition. As a result, the magnetoresistive element 20 produces high output, and has increased sensitivity to a signal magnetic field.

The protection layer 40 is formed of a non-magnetic conductive material. For example, the protection layer 40 is formed of a metal film containing one of Ru, Cu, Ta, Au, Al, and W. Further, the protection layer 40 may also be formed of a layered body of such metal films. The protection layer 40 can prevent oxidation of the free magnetization layer 39 at the time of below-described heat treatment for causing the antiferromagnetism of the antiferromagnetic layer 32 to appear.

As a variation of the GMR film 30 of the first example, whose graphical illustration is omitted, it is preferable to further provide another diffusion prevention layer whose material and thickness are selected from the same range of materials and range of thickness as those of the diffusion prevention layer 38 between the free magnetization layer 39 and the protection layer 40. Depending on the material of the protection layer 40, Mn in the free magnetization layer 39 may diffuse into the protection layer 40. This reduces the magnetic moment of the free magnetization layer 39 so that the magnetoresistance change ΔRA is reduced. It is possible to avoid degradation of ΔRA by preventing diffusion of Mn by providing another diffusion prevention layer between the free magnetization layer 39 and the protection layer 40.

Next, a description is given, with reference to FIG. 2, of a method of forming the GMR film 30 of the first example. First, each of the underlayer 31 through the protection layer 40 is formed using the above-described corresponding material by sputtering, vapor deposition, or CVD.

Next, the layered body thus obtained is subjected to heat treatment while applying a magnetic field of a predetermined direction thereto. The heat treatment is performed in a vacuum atmosphere with, for example, a heating temperature of 250° C. to 320° C., a heating time of 2-4 hrs., and an applied magnetic field of 1592 kA/m. This heat treatment makes it possible to set the direction of magnetization of the antiferromagnetic layer 32 to a predetermined direction, so that it is possible to fix the magnetization of the fixed magnetization layer 33 to a predetermined direction through the exchange interaction between the antiferromagnetic layer 32 and the fixed magnetic layer 33. In this heat treatment, some of the above-described Mn-TM alloys become ordered alloys so as to have antiferromagnetism appear.

Thus, in the GMR film 30 of the first example, the magnetoresistance change ΔRA is great since the free magnetization layer 39 is formed of CoMnAl, and the free magnetization layer 30 has a low coercive force since the composition of CoMnAl of the free magnetization layer 39 is within the above-described predetermined composition range. Accordingly, it is possible to achieve a high-output magnetoresistive element having good signal magnetic field detection sensitivity.

Further, the GMR film 30 of the first example includes the diffusion prevention layer 38 between the non-magnetic metal layer 37 and the free magnetization layer 39 so as to prevent Mn included in the free magnetization layer 39 from diffusing into the non-magnetic metal layer 37. Accordingly, it is possible to prevent degradation of ΔRA of the magnetoresistive element 20. In particular, by using CoNiFe for the diffusion prevention layer 38, it is possible to increase ΔRA and decrease the coercive force of the layered body of the free magnetization layer 39 and the diffusion prevention layer 38 at the same time. As a result, it is possible to achieve a magnetoresistive element of higher output with better signal magnetic field detection sensitivity.

Next, a description is given of the GMR film of the second example forming the magnetoresistive element 20 according to the first embodiment of the present invention. The GMR film of the second example is a variation of the GMR film 30 of the first example shown in FIG. 2.

Figure 3:
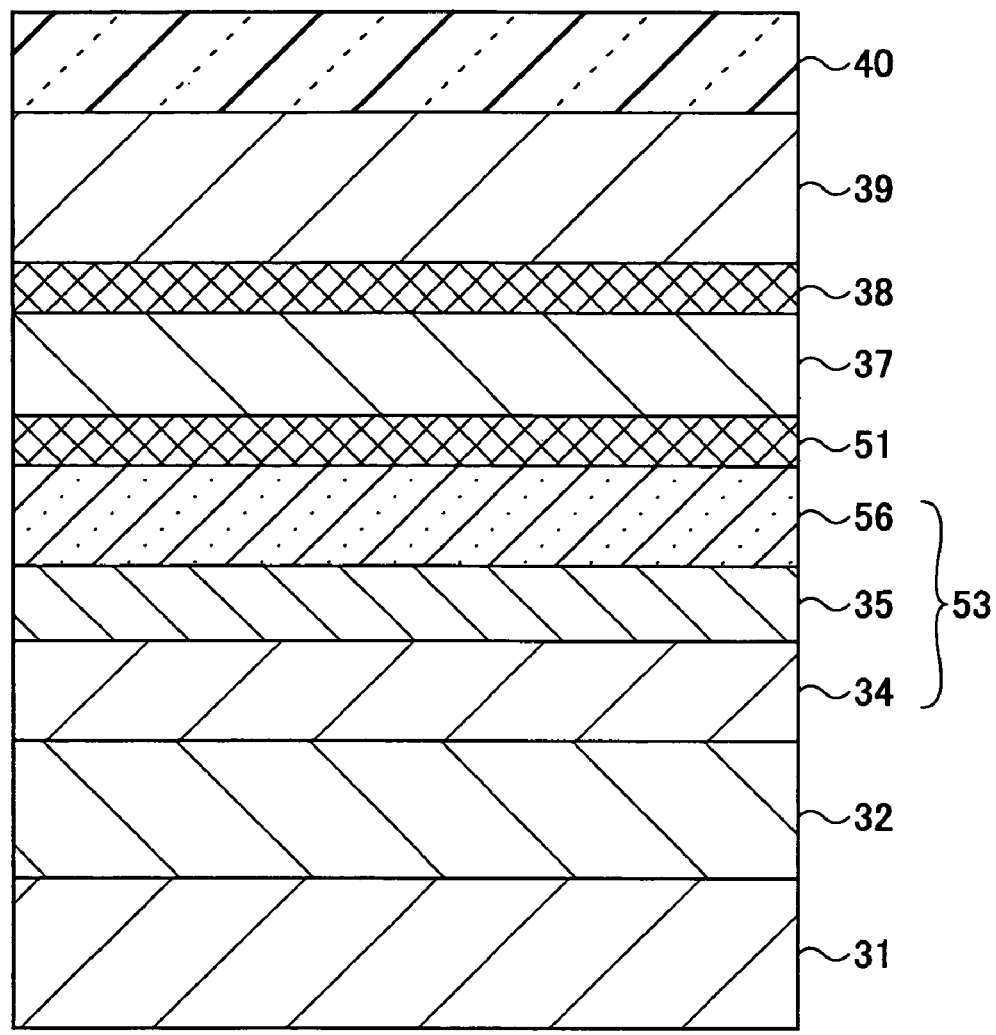
FIG. 3 is a cross-sectional view of a second example GMR film forming the magnetoresistive element according to the first embodiment of the present invention.

FIG. 3 is a cross-sectional view of a GMR film 50 of the second example forming the magnetoresistive element 20 according to the first embodiment. In FIG. 3, the same elements as those described above are referred to by the same numerals, and a description thereof is omitted.

Referring to FIG. 3, the GMR film 50 of the second example includes the underlayer 31, the antiferromagnetic layer 32, a fixed magnetization layered body 53, a second diffusion prevention layer 51, the non-magnetic metal layer 37, the first diffusion prevention layer 38, the free magnetization layer 39, and the protection layer 40, which are stacked successively. The fixed magnetization layered body 53 is formed by stacking the first fixed magnetization layer 34, the non-magnetic coupling layer 35, and a second fixed magnetization layer 56 in order from the antiferromagnetic layer 32 side. The GMR film 50 has a single spin-valve structure. The first diffusion prevention layer 38, which has the same material and film thickness as the diffusion prevention layer 38 of FIG. 2, is referred to by the same numeral.

The GMR film 50 has the same configuration as the GMR film 30 of the first example shown in FIG. 2 except that the second fixed magnetization layer 56 is formed of a ferromagnetic material expressed by the general formula CoMnZ (where Z is at least one element selected from Al, Si, Ga, Ge, Cu, Mg, V, Cr, In, Sn, B, and Ni) and forming the crystal structure of a Heusler alloy with a composition of $Co_{50}Mn_{25}Z_{25}$ (in which each content is expressed in at. %) and that the second diffusion prevention layer 51 is provided between the second fixed magnetization layer 56 and the non-magnetic metal layer 37.

The ferromagnetic material of the second fixed magnetization layer 56 does not have an adverse effect on the properties of the magnetoresistive element 20 even if the ferromagnetic material has a high coercive force. Accordingly, the ferromagnetic material of the second fixed magnetization layer 56 is selected from a composition range of large spin-dependent bulk scattering coefficients. As a result, it is possible to increase ΔRA.

Further, it is preferable that the second fixed magnetization layer 56 be formed of CoMnAl. The coercive force of the second fixed magnetization layer 56 is not limited. Accordingly, a CoMnAl composition having a large spin-dependent bulk scattering coefficient may be selected. In the composition of CoMnAl, the Co content is required to be 20 at. % or over in order that CoMnAl shows ferromagnetism, and the Al content is required to be 10 at. % or over in order that CoMnAl has a sufficient specific resistance.

Further, the second diffusion prevention layer 51 is provided between the second fixed magnetization layer 56 and the non-magnetic metal layer 37. Accordingly, it is possible to prevent Mn of the second fixed magnetization layer 56 from diffusing into the non-magnetic metal layer 37. In particular, Mn becomes easily diffusible when the GMR film 50 is exposed to high temperatures in heat treatment in a magnetic field. However, it is possible to prevent diffusion of Mn with the first and second diffusion prevention layers 38 and 51. As a result, it is possible to prevent degradation of ΔRA.

Thus, in the GMR film 50 of the second example, the magnetoresistance change ΔRA is great since the second fixed magnetization layer 56 is formed of CoMnZ, and the composition of CoMnAl of the free magnetization layer 39 is within the above-described composition range so that the free magnetization layer 39 has a low coercive force. Accordingly, it is possible to achieve a high-output magnetoresistive element having good signal magnetic field detection sensitivity.

Next, a description is given of the GMR film of the third example forming the magnetoresistive element 20 according to the first embodiment of the present invention. The third example is a variation of the GMR film 30 of the first example shown in FIG. 2.

Figure 4:
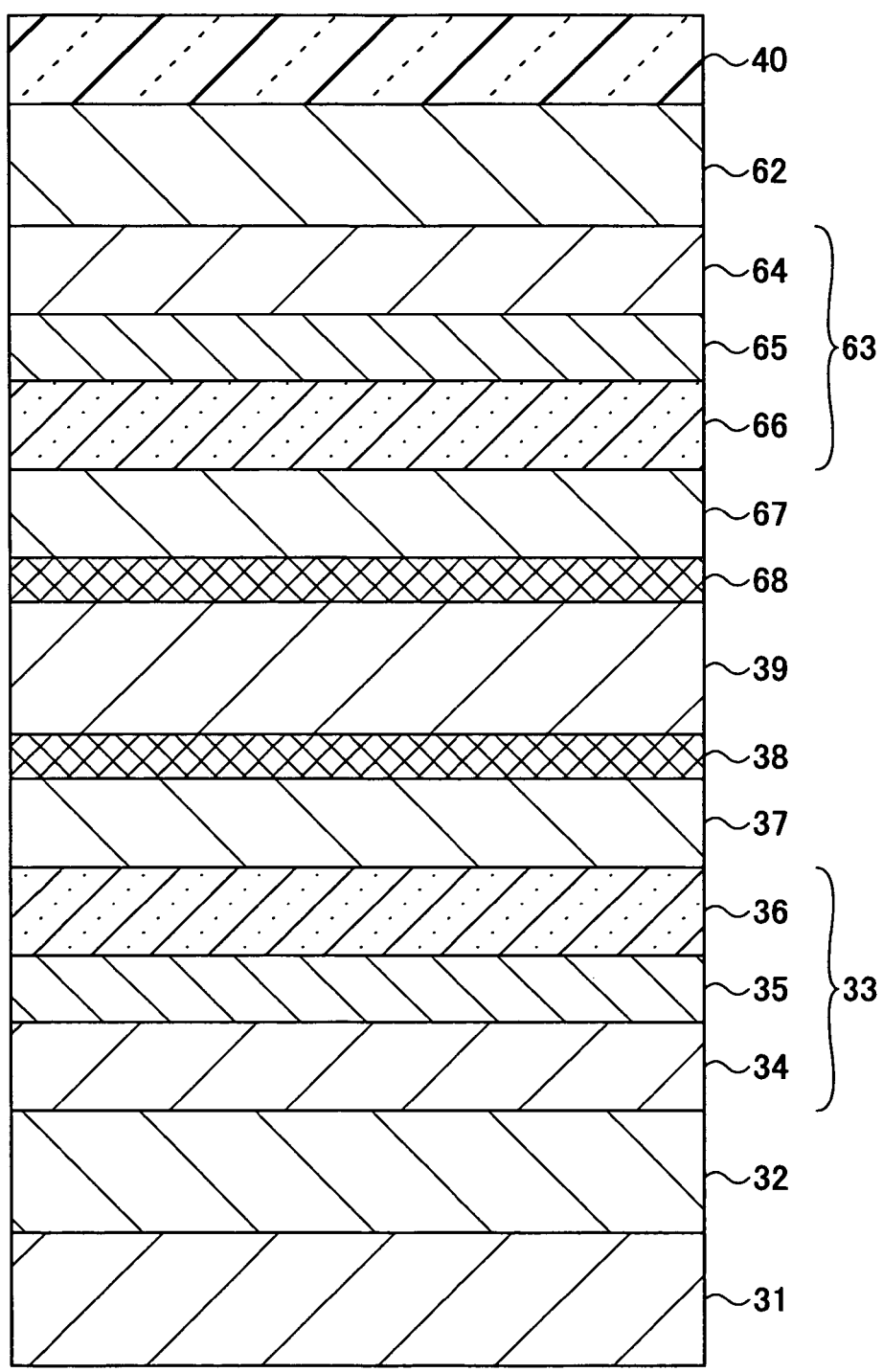
FIG. 4 is a cross-sectional view of a third example GMR film forming the magnetoresistive element according to the first embodiment of the present invention.

FIG. 4 is a cross-sectional view of a GMR film 60 of the third example forming the magnetoresistive element according to the first embodiment. In FIG. 4, the same elements as those described above are referred to by the same numerals, and a description thereof is omitted.

Referring to FIG. 4, the GMR film 60 of the third example includes the underlayer 31, the lower antiferromagnetic layer 32, the lower fixed magnetization layered body 33, the lower non-magnetic metal layer 37, the lower diffusion prevention layer 38, the free magnetization layer 39, an upper diffusion prevention layer 68, an upper non-magnetic metal layer 67, an upper fixed magnetization layered body 63, an upper antiferromagnetic layer 62, and the protection layer 40, which are stacked successively. That is, the GMR film 60 has a configuration where the upper diffusion prevention layer 68, the upper non-magnetic metal layer 67, the upper fixed magnetization layered body 63, and the upper antiferromagnetic layer 62 are provided between the free magnetization layer 39 and the protection layer 40 of the GMR film 30 of the first example shown in FIG. 2. The GMR film 60 has a so-called dual spin-valve structure. The lower antiferromagnetic layer 32, the lower fixed magnetization layered body 33, the lower non-magnetic metal layer 37, and the lower diffusion prevention layer 38 are equal in material and film thickness to the antiferromagnetic layer 32, the fixed magnetization layered body 33, the non-magnetic metal layer 37, and the diffusion prevention layer 38, respectively, of the GMR film 30 of the first example shown in FIG. 2, and accordingly, are referred to by the same numerals.

Further, the upper diffusion prevention layer 68, the upper non-magnetic metal layer 67, and the upper antiferromagnetic layer 62 may employ the same materials and have their film thicknesses set within the same ranges as the lower diffusion prevention layer 38, the lower non-magnetic metal layer 37, and the lower antiferromagnetic layer 32, respectively.

The upper fixed magnetization layered body 63 has a so-called synthetic ferrimagnetic structure, where an upper second fixed magnetization layer 66, an upper non-magnetic coupling layer 65, and an upper first fixed magnetization layer 64 are stacked in order from the upper non-magnetic metal layer 67 side. The upper first fixed magnetization layer 64, the upper non-magnetic coupling layer 65, and the upper second fixed magnetization layer 66 may employ the same materials and have their film thicknesses set within the same ranges as the lower first fixed magnetization layer 34, the lower non-magnetic coupling layer 35, and the lower second fixed magnetization layer 36, respectively.

In the GMR film 60, the CoMnAl composition of the free magnetization layer 39 is selected from the same composition range as that of the free magnetization layer 39 of the GMR film 30 of the first example shown in FIG. 2. Accordingly, the coercive force of the free magnetization layer 39 is reduced for the same reason as in the case of the GMR film 30 of the first example. Accordingly, the magnetoresistive element 20 with the GMR film 60 is more sensitive to a signal magnetic field.

Further, the GMR film 60 has the lower diffusion prevention layer 38 between the free magnetization layer 39 and the lower non-magnetic metal layer 37, and has the upper diffusion prevention layer 68 between the free magnetization layer 39 and the upper non-magnetic metal layer 67. Accordingly, Mn included in the free magnetization layer 39 is prevented from diffusing into the lower non-magnetic metal layer 37 and the upper non-magnetic metal layer 67. As a result, it is possible to prevent degradation of ΔRA.

Furthermore, the GMR film 60 has both the spin-valve structure formed of the lower fixed magnetization layered body 33, the lower non-magnetic metal layer 37, the lower diffusion prevention layer 38, and the free magnetization layer 39 and the spin-valve structure formed of the free magnetization layer 39, the upper diffusion prevention layer 68, the upper non-magnetic metal layer 67, and the upper fixed magnetization layered body 63. Accordingly, the magnetoresistance change ΔRA of the GMR film 60 increases so as to be substantially twice the magnetoresistance change ΔRA of the GMR film 30 of the first example. As a result, a magnetoresistive element of higher output can be achieved with the GMR film 60 of the third example than with the GMR film 30 of the first example. The method of forming the GMR film 60 is substantially the same as the method of forming the GMR film 30 of the first example, and accordingly, a description thereof is omitted.

Thus, the GMR film 60 of the third example produces the same effects as the GMR film 30 of the first example, and has a magnetoresistance change ΔRA substantially twice the magnetoresistance change ΔRA of the GMR film 30 of the first example. As a result, it is possible to achieve a magnetoresistive element of higher output.

Next, a description is given of the GMR film of the fourth example forming the magnetoresistive element 20 according to the first embodiment of the present invention. The fourth example is a variation of the GMR film 60 of the third example shown in FIG. 4.

Figure 5:
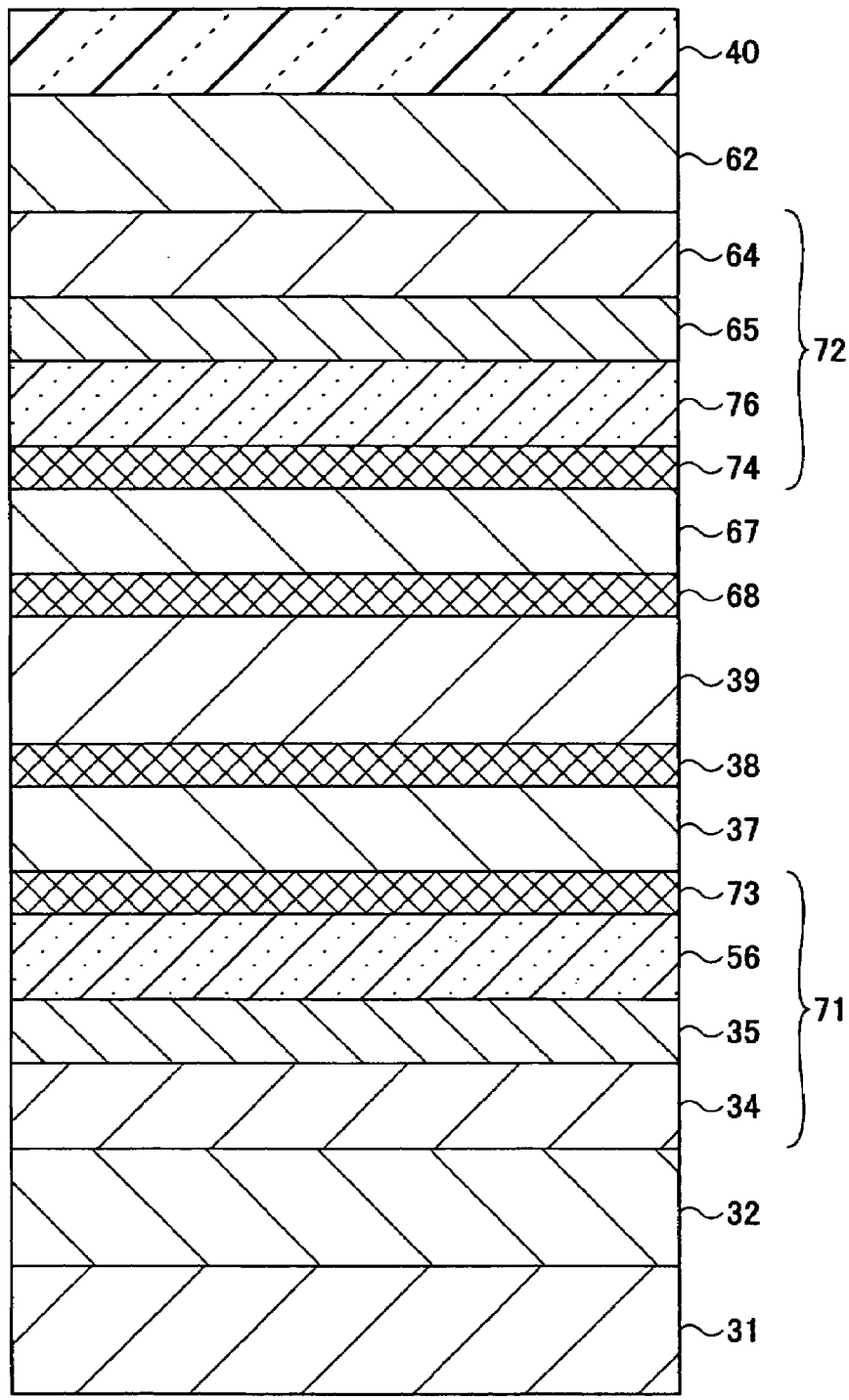
FIG. 5 is a cross-sectional view of a fourth example GMR film forming the magnetoresistive element according to the first embodiment of the present invention.

FIG. 5 is a cross-sectional view of a GMR film 70 of the fourth example forming the magnetoresistive element 20 according to the first embodiment. In FIG. 5, the same elements as those described above are referred to by the same numerals, and a description thereof is omitted.

Referring to FIG. 5, the GMR film 70 of the fourth example includes the underlayer 31, the lower antiferromagnetic layer 32, a lower fixed magnetization layered body 71, the lower non-magnetic metal layer 37, the lower second diffusion prevention layer 38, the free magnetization layer 39, the upper first diffusion prevention layer 68, the upper non-magnetic metal layer 67, an upper fixed magnetization layered body 72, the upper antiferromagnetic layer 62, and the protection layer 40, which are stacked successively. The lower fixed magnetization layered body 71 is formed by stacking the lower first fixed magnetization layer 34, the lower non-magnetic coupling layer 35, the lower second fixed magnetization layer 56, and a lower second diffusion prevention layer 73 in order from the lower antiferromagnetic layer 32 side. Further, the upper fixed magnetization layered body 72 is formed by stacking an upper second diffusion prevention layer 74, an upper second fixed magnetization layer 76, the upper non-magnetic coupling layer 65, and the upper first fixed magnetization layer 64 in order from the upper non-magnetic metal layer 67 side.

In the GMR film 70, each of the lower second fixed magnetization layer 56 and the upper second fixed magnetization layer 76 is formed of a ferromagnetic material expressed by the general formula CoMnZ (where Z is at least one element selected from Al, Si, Ga, Ge, Cu, Mg, V, Cr, In, Sn, B, and Ni) and forming the crystal structure of a Heusler alloy with a composition of $Co_{50}Mn_{25}Z_{25}$ (in which each content is expressed in at. %). Further, the GMR film 70 has the lower second diffusion prevention layer 73 provided between the lower second fixed magnetization layer 56 and the lower non-magnetic metal layer 37, and has the upper second diffusion prevention layer 74 provided between the upper non-magnetic metal layer 67 and the upper second fixed magnetization layer 76. Except for these points, the GMR film 70 has the same configuration as the GMR film 60 of the third example shown in FIG. 4.

Each of the lower second fixed magnetization layer 56 and the upper second fixed magnetization layer 76 is formed of CoMnZ described above, has a large spin-dependent bulk scattering coefficient, and has a large specific resistance. Accordingly, it is possible to further increase ΔRA. On the other hand, since the lower second diffusion prevention layer 73 and the upper second diffusion prevention layer 74 are provided, it is possible to prevent diffusion of Mn from the lower second fixed magnetization layer 56 and the upper second fixed magnetization layer 76 into the lower non-magnetic metal layer 37 and the upper non-magnetic metal layer 67, respectively.

Thus, the GMR film 70 produces the same effects as the GMR film 60 of the third example. Further, since each of the lower second diffusion prevention layer 73 and the upper second diffusion prevention layer 74 is formed of CoMnZ, it is possible to increase the magnetoresistance change ΔRA and to further increase output.

Next, a description is given of the GMR film of the fifth example forming the magnetoresistive element 20 according to the first embodiment of the present invention. The fifth example is a variation of the GMR film 70 of the fourth example shown in FIG. 5.

Figure 6:
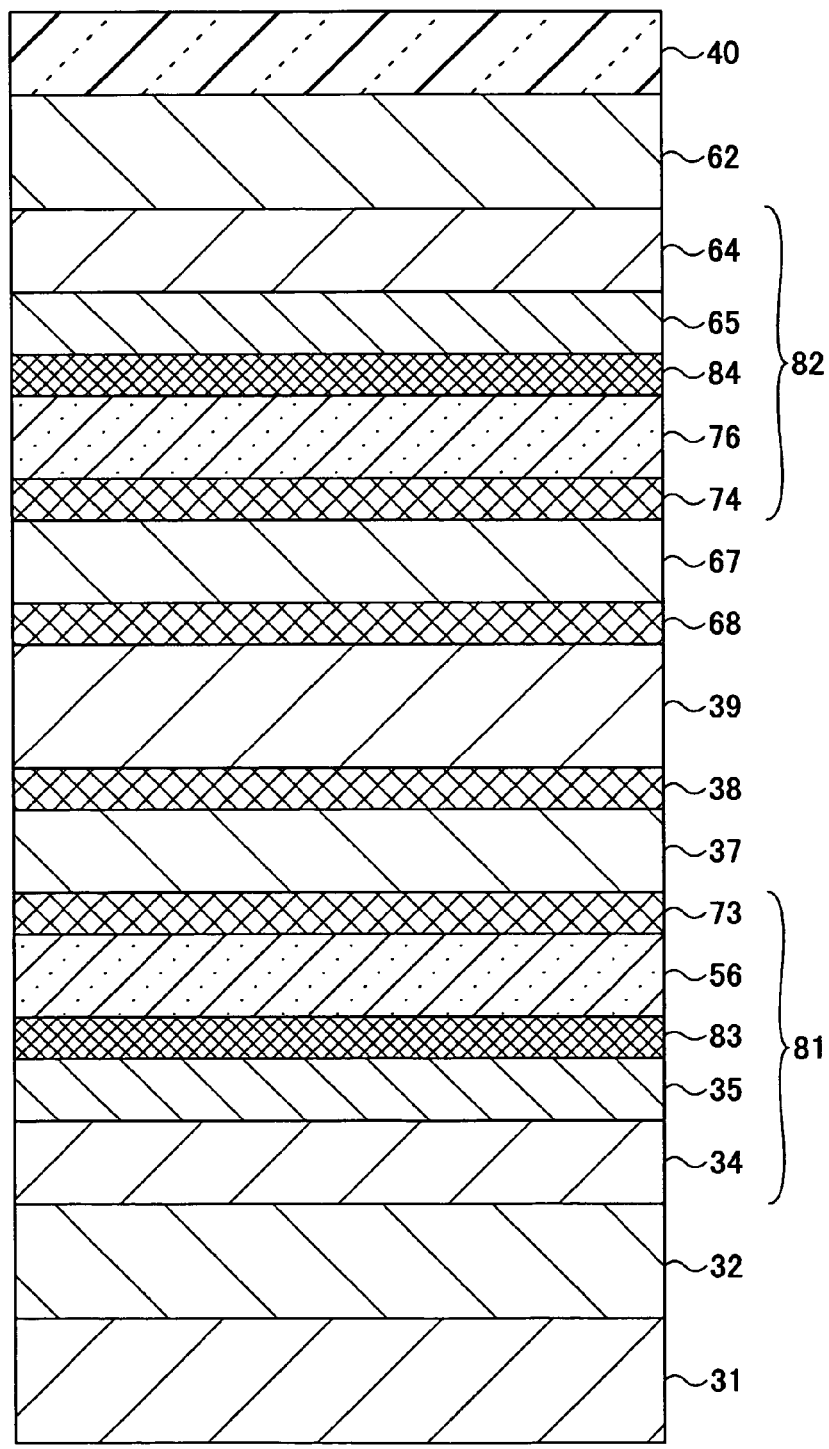
FIG. 6 is a cross-sectional view of a fifth example GMR film forming the magnetoresistive element according to the first embodiment of the present invention.

FIG. 6 is a cross-sectional view of a GMR film 80 of the fifth example forming the magnetoresistive element 20 according to the first embodiment. In FIG. 6, the same elements as those described above are referred to by the same numerals, and a description thereof is omitted.

Referring to FIG. 6, the GMR film 80 of the fifth example includes the underlayer 31, the lower antiferromagnetic layer 32, a lower fixed magnetization layered body 81, the lower non-magnetic metal layer 37, the lower second diffusion prevention layer 38, the free magnetization layer 39, the upper first diffusion prevention layer 68, the upper non-magnetic metal layer 67, an upper fixed magnetization layered body 82, the upper antiferromagnetic layer 62, and the protection layer 40, which are stacked successively. The lower fixed magnetization layered body 81 is formed by stacking the lower first fixed magnetization layer 34, the lower non-magnetic coupling layer 35, a lower interface magnetic layer 83, the lower second fixed magnetization layer 56, and the lower second diffusion prevention layer 73 in order from the lower antiferromagnetic layer 32 side. Further, the upper fixed magnetization layered body 82 is formed by stacking the upper second diffusion prevention layer 74, the upper second fixed magnetization layer 76, an upper interface magnetic layer 84, the upper non-magnetic coupling layer 65, and the upper first fixed magnetization layer 64 in order from the upper non-magnetic metal layer 67 side. That is, the GMR film 80 is configured by providing the lower interface magnetic layer 83 between the lower non-magnetic coupling layer 35 and the lower second fixed magnetization layer 56 of the GMR film 70 of the fourth example shown in FIG. 5 and further providing the upper interface magnetic layer 84 between the upper second fixed magnetization layer 76 and the upper non-magnetic coupling layer 65 of the GMR film 70.

Each of the lower interface magnetic layer 83 and the upper interface magnetic layer 84 is within the range of 0.2 nm to 2.5 nm in thickness, and is formed of a ferromagnetic material. It is preferable that the material of each of the lower interface magnetic layer 83 and the upper interface magnetic layer 84 be selected from materials greater in spin-dependent interface scattering than CoMnAl, such as CoFe, CoFe alloys, NiFe, and NiFe alloys. CoFe alloys include, for example, CoFeNi, CoFeCu, and CoFeCr. NiFe alloys include, for example, NiFeCu and NiFeCr. As a result, it is possible to increase the magnetoresistance change ΔRA. Materials having the same composition, materials that contain the same elements with different composition ratios, and materials formed of elements different from each other may be employed for the lower interface magnetic layer 83 and the upper interface magnetic layer 84.

Further, it is preferable to select the material and thickness of each of the lower interface magnetic layer 83 and the upper interface magnetic layer 84 from the same range of materials and range of thickness as those of the diffusion prevention layer 38 of the GMR film 30 of the first example shown in FIG. 2. This makes it possible to prevent diffusion of Mn from the lower second fixed magnetization layer 56 and the upper second fixed magnetization layer 76 each formed of CoMnZ into the lower non-magnetic coupling layer 35 and the upper non-magnetic coupling layer 65, respectively. This prevents reduction in the magnetic moment of each of the lower interface magnetic layer 83 and the upper interface magnetic layer 84, so that it is possible to prevent degradation of the magnetoresistance change ΔRA.

Thus, the GMR film 80 of the fifth example produces the same effects as the GMR film 70 of the fourth example. Further, with the lower interface magnetic layer 83 and the upper interface magnetic layer 84 being provided, the GMR film 80 can have a greater magnetoresistance change ΔRA and thus produce higher output than the GMR film 70 of the fourth example.

EXAMPLE IMPLEMENTATION

In an example implementation, magnetoresistive elements having the configuration of the GMR film 80 of the fifth example of the first embodiment shown in FIG. 6 were made. The specific configuration of the GMR films of Samples No. 1 through No. 20 of the example implementation is shown below. The parenthesized numeric values show film thickness, which remains the same through the example implementation.

Underlayer: NiCr (4 nm)
Lower antiferromagnetic layer: IrMn (5 nm)
Lower first fixed magnetization layer: $Co_{60}Fe_{40}$ (3.5 nm)
Lower non-magnetic coupling layer: Ru (0.7 nm)
Lower interface magnetic layer: CoFe (0.5 nm)
Lower second fixed magnetization layer: $Co_{100-X-Y}Mn_XAl_Y$
Lower second diffusion prevention layer: CoFe (0.5 nm)
Lower non-magnetic metal layer: Cu (3.5 nm)
Lower first diffusion prevention layer: CoFe (0.5 nm)
Free magnetization layer: $Co_{100-X-Y}Mn_XAl_Y$
Upper first diffusion prevention layer: CoFe (0.5 nm)

Upper non-magnetic metal layer: Cu (3.5 nm)
Upper second diffusion prevention layer: CoFe (0.5 nm)
Upper second fixed magnetization layer: $Co_{100-X-Y}Mn_XAl_Y$
Upper interface magnetic layer: CoFe (0.5 nm)
Upper non-magnetic coupling layer: Ru (0.7 nm)
Upper first fixed magnetization layer: $Co_{60}Fe_{40}$ (3.5 nm)
Upper antiferromagnetic layer: IrMn (5 nm)
Protection layer: Ru (5 nm)

The composition $Co_{100-X-Y}Mn_XAl_Y$ was common to the lower second fixed magnetization layer, the free magnetization layer, and the upper second fixed magnetization layer in each sample. Further, the film thickness of each of the lower second fixed magnetization layer, the free magnetization layer, and the upper second fixed magnetization layer was selected so that the product of saturation flux density and film thickness was 7 nTm. Further, each of X and Y is a content expressed in at. %.

FIG. 7 shows the relationship between the composition and the coercive force of the free magnetization layer of the example implementation according to the first embodiment.

Referring to FIG. 7, the composition of CoMnAl employed for the lower second fixed magnetization layer, the free magnetization layer, and the upper second fixed magnetization layer differs among Samples No. 1 through No. 20 of the example implementation. Each sample of this example implementation was made as follows.

On a silicon substrate on which a thermal oxide film was formed, a layered film of Cu (250 nm) and NiFe (50 nm) from the silicon substrate side was formed. Then, each of the layers of the layered body from the underlayer to the protection layer having the above-described compositions and film thicknesses was formed in an ultra-high vacuum (a vacuum of $2\times10^{-6}$ or below) atmosphere without heating the substrate using a sputtering apparatus.

Next, heat treatment was performed in order to cause the antiferromagnetism of the antiferromagnetic layer to appear. The conditions of the heat treatment were a heating temperature of 300° C., a treatment time of 3 hours, and an applied magnetic field of 1952 kA/m.

Next, the layered body thus obtained was ground by ion milling, so that layered bodies having six types of joining areas ranging from 0.1 μm² to 0.6 μm² were made. For each joining area, 40 layered bodies were made.

Next, the layered bodies thus obtained were covered with a silicon oxide film. Then, the protection layer was exposed by dry etching, and an upper electrode of a Au film was formed so as to be in contact with the protection layer.

The coercive force of the free magnetization layer was measured with respect to each of Samples No. 1 through No. 20 thus obtained. The free magnetization layer is ferromagnetically coupled to the lower first diffusion prevention layer and the upper first diffusion prevention layer. Accordingly, the coercive force obtained by the measurement is the coercive force of a layered body into which these three layers are integrated. The coercive force was determined from a magnetoresistance curve by a DC four-probe method.

Further, ΔRA of each of Sample Nos. 5, 9, 13, and 17 through 20 was measured. These samples have compositions on the line PQ shown below in FIG. 8. In measuring ΔRA, the magnetoresistance change ΔR was measured, and the average of the magnetoresistance change ΔR values was determined for magnetoresistive elements having substantially the same joining area. The magnetoresistance change of a unit area ΔRA was determined from the average magnetoresistance change ΔR value and the joining area A. Further, after confirming that the six types of magnetoresistive elements different in joining area A from one another have substantially the same ΔRA, the average of these ΔRA values was determined as the final ΔRA value.

In the measurement of the magnetoresistance change ΔR, with the current value of sense current being 2 mA, an external magnetic field sweep was performed parallel to the magnetization direction of the lower and upper second fixed magnetization layers within the range of −79 kA/m to 79 kA/m, and the voltage between the lower electrode and the upper electrode was measured with a digital voltmeter, thereby obtaining a magnetoresistance curve. Then, the magnetoresistance change ΔR was determined from the difference between the maximum value and the minimum value of the magnetoresistance curve.

Figure 8:
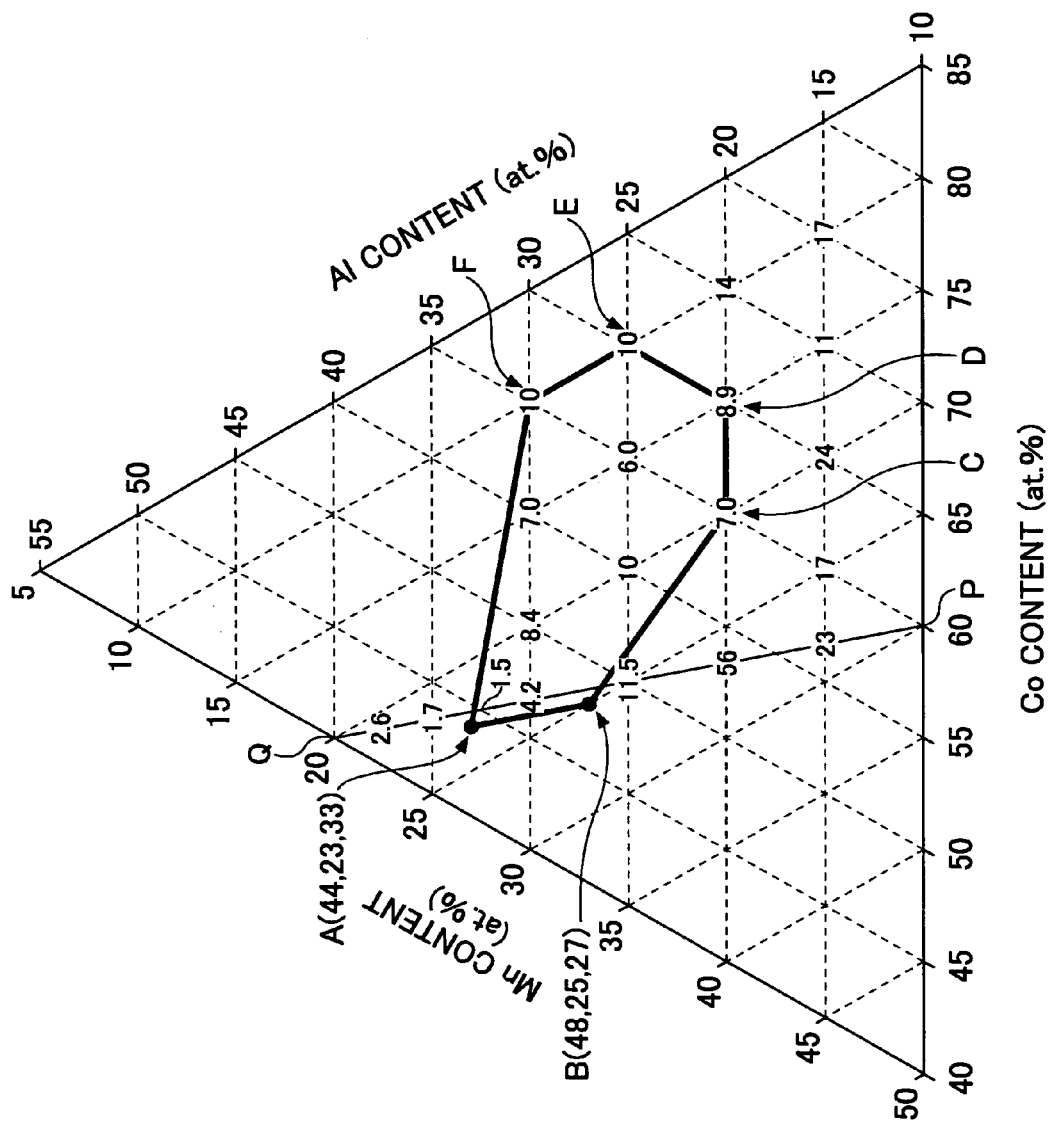
FIG. 8 is a diagram showing the coercive force and the composition range of the free magnetization layer according to the first embodiment of the present invention.

FIG. 8 is a diagram showing the coercive force and the composition range of the free magnetization layer. In FIG. 8, the values of the coercive force of the free magnetization layer shown in FIG. 7 are shown in a ternary composition diagram. In the ternary composition diagram, each broken line extending from the base to the right side of the triangle of FIG. 8 indicates a corresponding atomic percentage of the Co content, each broken line extending from the left side to the base of the triangle of FIG. 8 indicates a corresponding atomic percentage of the Mn content, and each broken line extending from the right side to the left side of the triangle of FIG. 8 indicates a corresponding atomic percentage of the Al content.

FIG. 8 shows that the coercive force of the free magnetization layer is 11.5 Oe with the Heusler alloy composition of $Co_{50}Mn_{25}Al_{25}$, while the coercive force is reduced with compositions on the higher Co content and lower Mn content side.

From this results, in that a coercive force lower than that of the Heusler alloy composition can be obtained, the CoMnAl composition of the free magnetization layer is set within the area (composition range) ABCDEFA formed by connecting Point A (44, 23, 33), Point B (48, 25, 27), Point C (60, 20, 20), Point D (65, 15, 20), Point E (65, 10, 25), Point F (60, 10, 30), and Point A with straight lines in this order in the ternary composition diagram of FIG. 8 where the coordinates of each composition are expressed as (Co content, Mn content, Al content). In this composition range, the coercive force of the free magnetization layer is less than 11.5 Oe. Accordingly, the coercive force of the free magnetization layer is lower than that of $Co_{50}Mn_{25}Al_{25}$, which is the Heusler alloy composition, thus resulting in good sensitivity to a signal magnetic field.

The coercive force of the free magnetization tends to increase in the composition range in which the Al content is less than 20 at. %. Accordingly, such a range is not preferable. Further, with the compositions higher in Al content than the side AF, the coercive force is reduced, but there is a significant reduction in saturation flux density due to an increase in Al, which is a non-magnetic element. It is necessary for the free magnetization layer that the product of its saturation flux density and film thickness is greater than or equal to a predetermined value. Accordingly, the compositions higher in Al content than the side AF are not preferable since with such compositions, the film thickness increases so as to incur an excessive increase in so-called read gap length.

Figure 9:
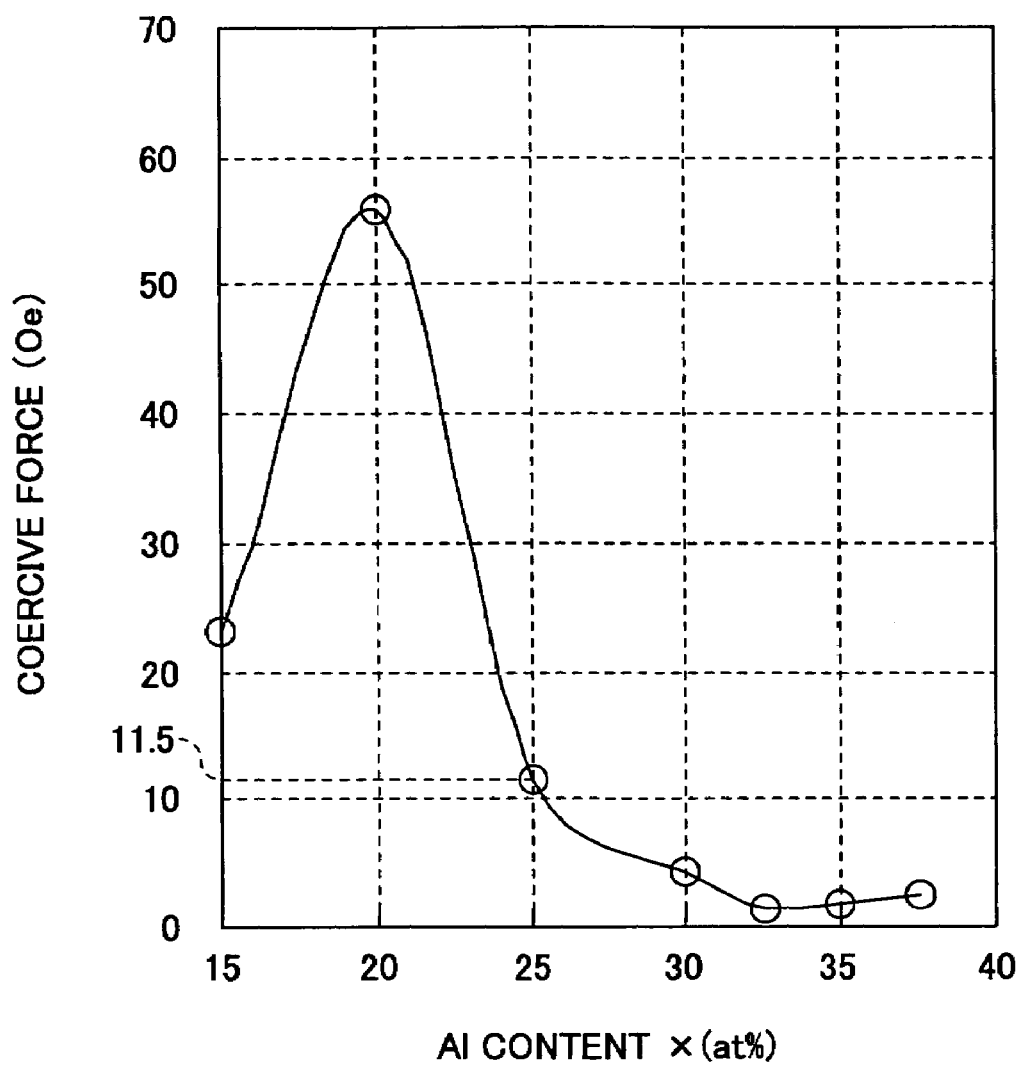
FIG. 9 is a graph showing the relationship between the coercive force and Al content of the free magnetization layer of the example implementation according to the first embodiment of the present invention.
Figure 10:
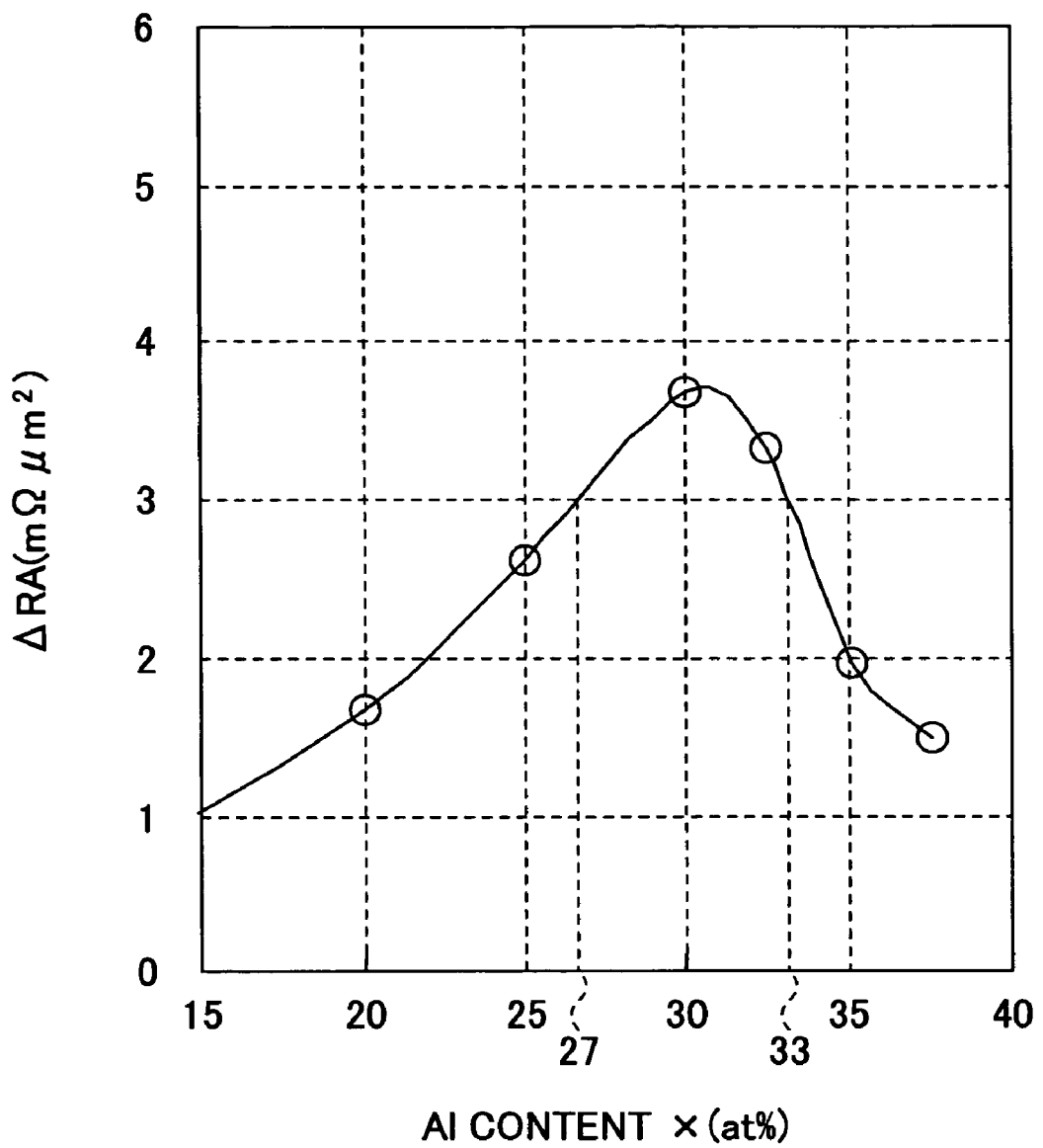
FIG. 10 is a graph showing the relationship between ΔRA and the Al content of the magnetoresistive element of the example implementation according to the first embodiment of the present invention.

FIG. 9 is a graph showing the relationship between the coercive force and the Al content of the free magnetization layer of the example implementation. FIG. 10 is a graph showing the relationship between ΔRA (mΩμm²) and the Al content of the magnetoresistive element of the example implementation. The samples shown in FIG. 9 and FIG. 10 have compositions where CoMnAl satisfies $(Co_2Mn)_{100-A}Al_A$ (A is 15.0 at. % to 38.0 at. %). These samples are of the compositions on the straight line PQ shown in FIG. 8, and are Sample Nos. 5, 9, 13, and 17 through 20 shown in FIG. 7.

FIG. 9 shows that in the case of an Al content of 25 at. %, that is, in the case of the Heusler alloy composition, the coercive force is 11.5 Oe, and that the coercive force is lower than 11.5 Oe with the compositions higher in Al content.

Referring to FIG. 10, with the compositions whose Al content is higher than 25 at. %, which is the Al content of the Heusler alloy composition, ΔRA increases to be maximized at an Al content of approximately 30 at. %. Meanwhile, ΔRA decreases with the compositions yet higher in Al content. This shows that the range of the Al content of 27 at. % to 33 at. % is more preferable in that ΔRA is greater than with the Heusler alloy composition. That is, it is shown that the compositions in the range where the Al content is 27 at. % to 33 at. % on the straight line PQ of FIG. 8 are more preferable in that the coercive force of the free magnetization is reduced and ΔRA is increased compared with the Heusler alloy composition. It is well inferred that this more preferable composition range is not limited to the straight line PQ and includes the range where the Co content is, for example, within ±1 at. % from the compositions of the straight line PQ.

According to this example implementation, the coercive force of the free magnetization layer can be lower than 11.5 Oe, which is the coercive force of the Heusler alloy composition ($Co_{50}Mn_{25}Al_{25}$), by selecting the composition of CoMnAl of the free magnetization layer from those in the area ABCDEFA shown in FIG. 8. The strength of a signal magnetic field from a magnetic recording medium is inevitably reduced with higher recording density. Accordingly, this reduction in the coercive force of the free magnetization layer makes it possible to achieve a magnetoresistive element enabling high recording density.

Second Embodiment

A magnetic head according to a second embodiment of the present invention includes a magnetoresistive element having a tunneling magnetoresistive (TMR) film. The magnetic head according to the second embodiment may have a configuration substantially the same as that of the magnetic head 10 shown in FIG. 1 except that a TMR film replaces the GMR film 30 forming the magnetoresistive element 20 of the magnetic head 10. Accordingly, a description of the magnetic head according to the second embodiment is omitted. A description is given below of five examples (first through fifth examples) with respect to the TMR film forming the magnetoresistive element 20. Any of the TMR films of the first through fifth examples may be applied to the magnetoresistive element 20.

Figure 11:
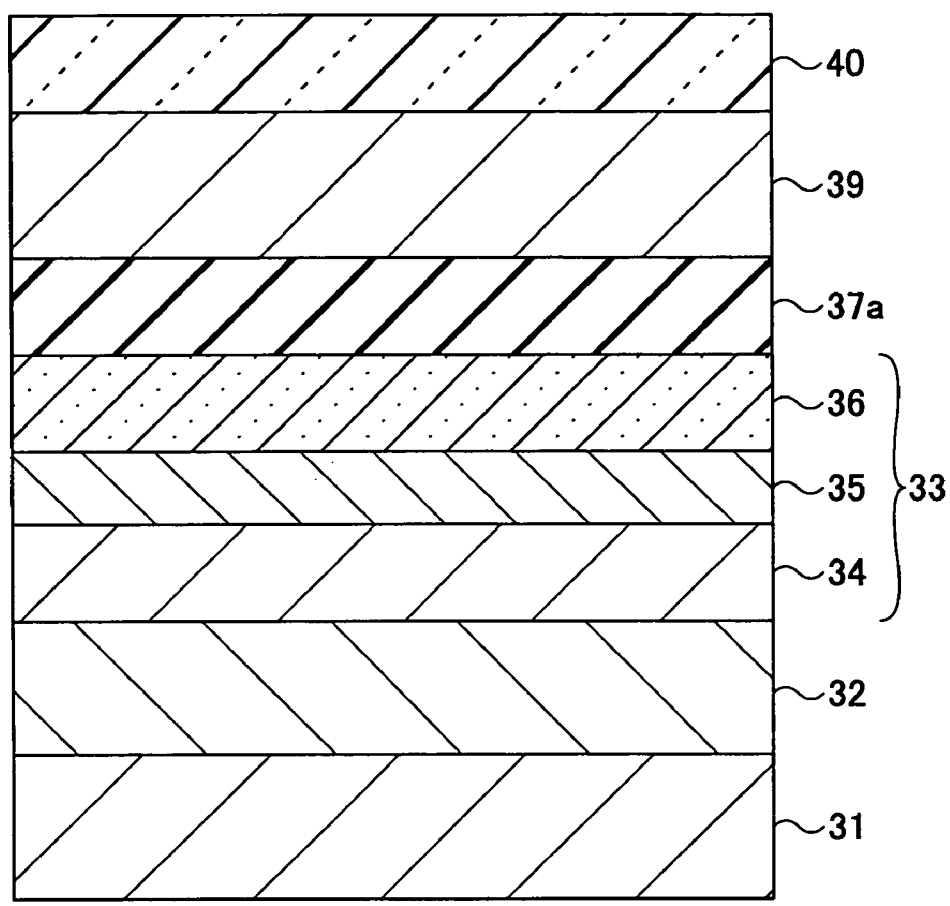
FIG. 11 is a cross-sectional view of a first example TMR film forming the magnetoresistive element according to a second embodiment of the present invention.

FIG. 11 is a cross-sectional view of a TMR film 90 of the first example forming the magnetoresistive element 20 according to the second embodiment. In FIG. 11, the same elements as those described above are referred to by the same numerals, and a description thereof is omitted.

Referring to FIG. 11, the TMR film 90 of the first example includes the underlayer 31, the antiferromagnetic layer 32, the fixed magnetization layered body 33, a non-magnetic insulating layer 37a, the free magnetization layer 39, and the protection layer 40, which are stacked successively.

The TMR film 90 has the same configuration as the GMR film 30 shown above in FIG. 2 except that the non-magnetic insulating layer 37a formed of an insulating material replaces the non-magnetic metal layer 37 and the diffusion prevention layer 38 is omitted. In the TMR film 90, a ferromagnetic tunnel effect is produced in accordance with the angle formed by the magnetization direction of the free magnetization layer 39 to the magnetization direction of the second fixed magnetization layer 36 by providing the non-magnetic insulating layer 37a between the free magnetization layer 39 and the second fixed magnetization layer 36, so that the electric resistance between the free magnetization layer 39 and the second fixed magnetization layer 36 changes.

The non-magnetic insulating layer 37a is, for example, 0.2 nm to 2.0 nm in thickness, and is formed of an oxide of one selected from the group consisting of Mg, Al, Ti, and Zr. Examples of such an oxide include MgO, $AlO_x$, $TiO_x$, and $ZrO_x$. Here, X shows that a composition may deviate from the composition of the compound of each material. In particular, it is preferable that the non-magnetic insulating layer 37a be crystalline MgO, and in particular, it is preferable that the (001) surface of MgO be substantially parallel to a film surface perpendicular to the direction of sense current in that the tunnel resistance change of the unit area of the film surface (hereinafter referred to as "tunnel resistance change" unless otherwise noted) increases. Alternatively, the non-magnetic insulating layer 37a may be formed of a nitride or oxynitride of one selected from the group of Al, Ti, and Zr. Examples of such a nitride include AlN, TiN, and ZrN.

The above-described material may be directly formed as the non-magnetic insulating layer 37a using sputtering, CVD, or vapor deposition. Alternatively, the non-magnetic insulating layer 37a may be formed by forming a metal film using sputtering, CVD, or vapor deposition and thereafter converting the metal film into an oxide film or a nitride film through oxidation or nitriding. A below-described upper non-magnetic insulating layer 67a of the third example (FIG. 13) may be formed in the same manner as the non-magnetic insulating film 37a.

Figure 13:
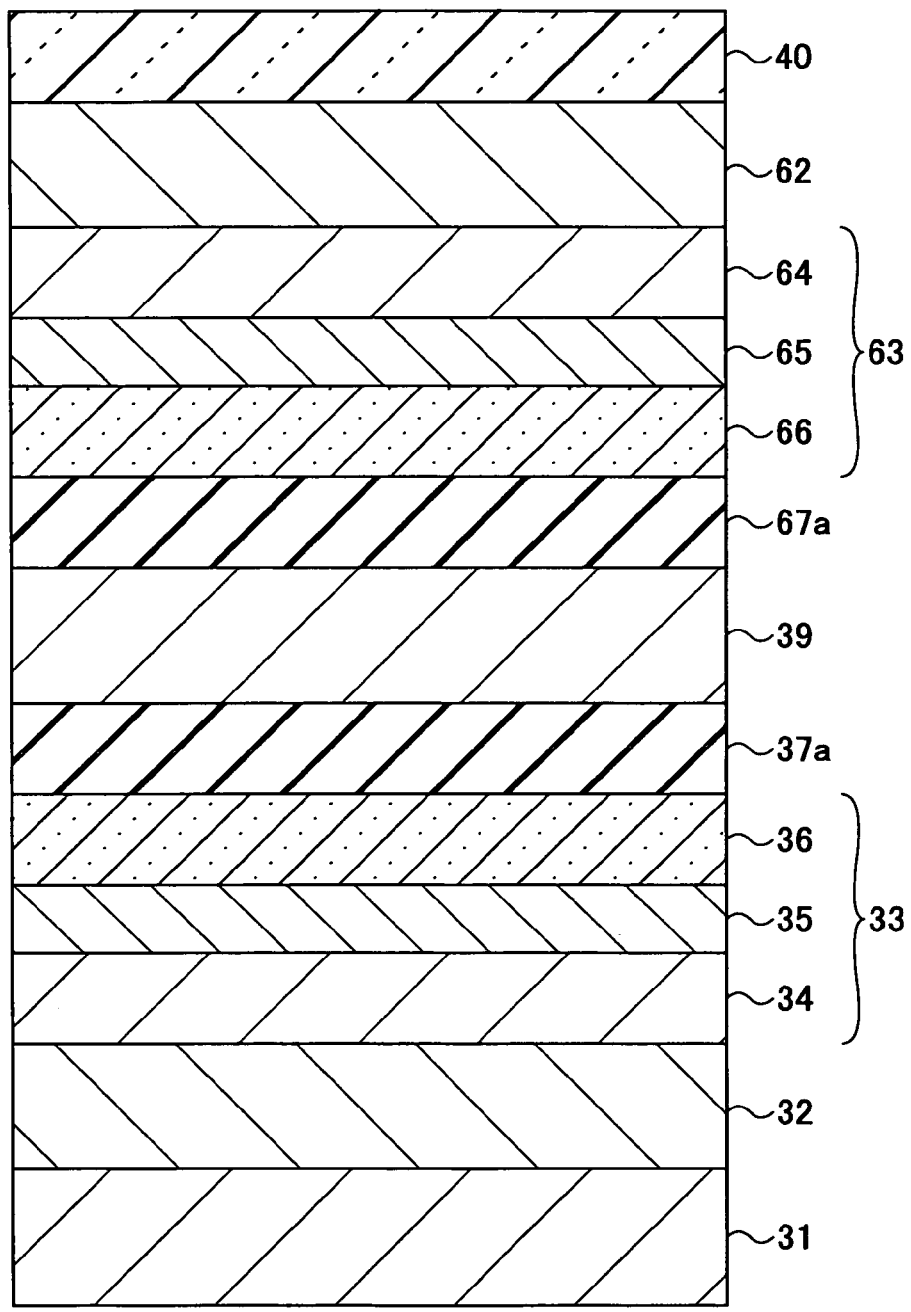
FIG. 13 is a cross-sectional view of a third example TMR film forming the magnetoresistive element according to the second embodiment of the present invention.

The tunnel resistance change is obtained in the same manner as the magnetoresistance change of the unit area ΔRA of the first embodiment is measured. The higher the spin polarization of each of the free magnetization layer 39 and the second fixed magnetization layer 36, the greater the tunnel resistance change. Here, the spin polarization is the spin polarization of the ferromagnetic layer (the free magnetization layer 39 or the second fixed magnetization layers 36) through the insulating film (the non-magnetic insulating layer 37a). The spin-dependent bulk scattering coefficient of CoMnAl is greater than those of NiFe and CoFe conventionally employed. Accordingly, by using CoMnAl for the free magnetization layer 39 as in the first embodiment, an increase in the tunnel resistance change of the unit area is expected. Further, an increase in the tunnel resistance change of the unit area is also expected by using CoMnAl for the second fixed magnetization layer 36. This also applies to the upper second fixed magnetization layer 66 of the third example (FIG. 13).

The composition range of CoMnAl of the free magnetization layer 39 is the same as the composition range of CoMnAl of the free magnetization layer 39 described in the first embodiment. That is, the CoMnAl composition of the free magnetization layer 39 is set within the area (composition range) ABCDEFA formed by connecting Point A (44, 23, 33), Point B (48, 25, 27), Point C (60, 20, 20), Point D (65, 15, 20), Point E (65, 10, 25), Point F (60, 10, 30), and Point A with straight lines in this order in the ternary composition diagram shown in FIG. 8 where the coordinates of each composition are expressed as (Co content, Mn content, Al content). As a result, the coercive force of the free magnetization layer 39 is reduced, so that it is possible to achieve a magnetoresistive element having a TMR film with good sensitivity to a signal magnetic field.

The diffusion prevention layer 38 shown in FIG. 2 is not provided in the TMR film 90. This is because Mn contained in CoMnAl of the free magnetization layer 39 hardly diffuses into the non-magnetic insulating layer 37a so that the tunnel resistance change is not adversely affected. Alternatively, the diffusion prevention layer may be provided as in the TMR film of the second example described below.

Next, a description is given of the TMR film of the second example forming the magnetoresistive element 20 according to the second embodiment. The TMR film of the second example is a variation of the TMR film 90 of the first example shown in FIG. 11.

Figure 12:
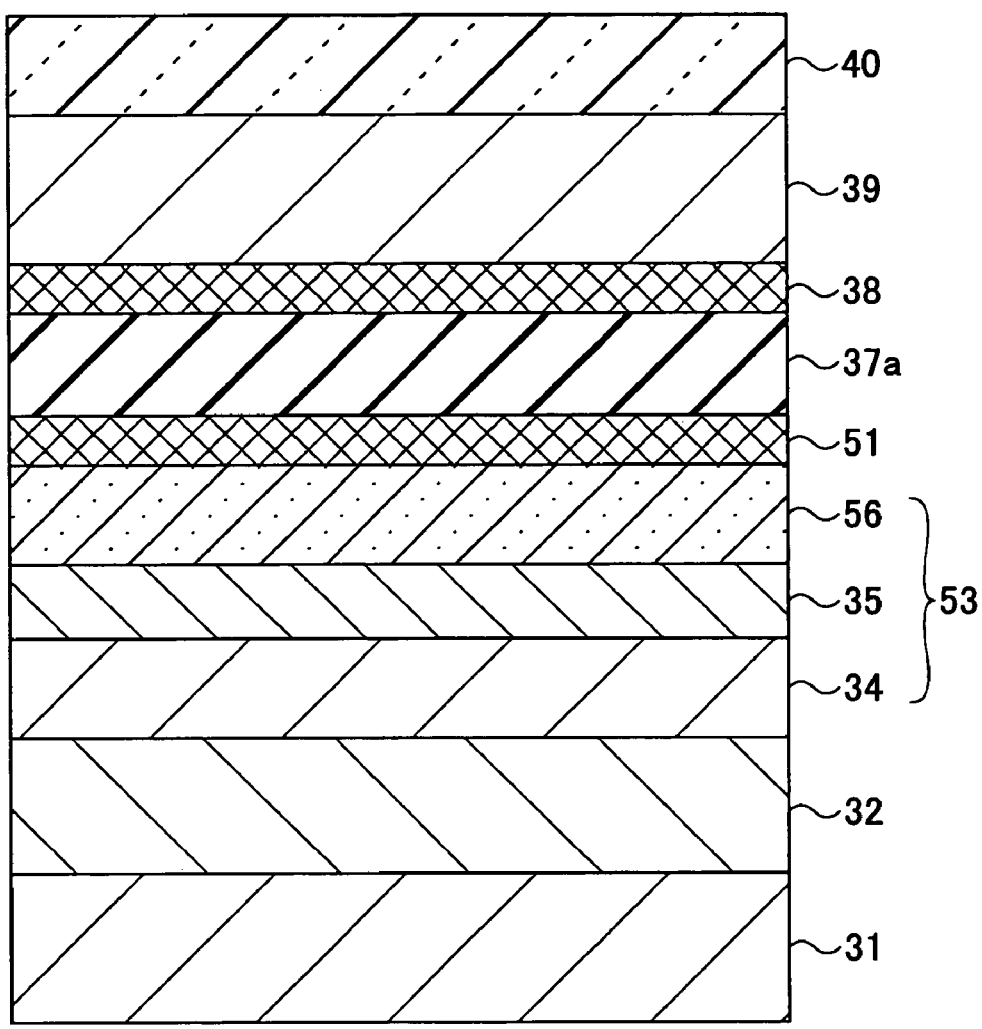
FIG. 12 is a cross-sectional view of a second example TMR film forming the magnetoresistive element according to the second embodiment of the present invention.

FIG. 12 is a cross-sectional view of a TMR film 91 of the second example forming the magnetoresistive element 20 according to the second embodiment. In FIG. 12, the same elements as those described above are referred to by the same numerals, and a description thereof is omitted.

Referring to FIG. 12, the TMR film 91 of the second example includes the underlayer 31, the antiferromagnetic layer 32, the fixed magnetization layered body 53, the second diffusion prevention layer 51, the non-magnetic insulating layer 37a, the first diffusion prevention layer 38, the free magnetization layer 39, and the protection layer 40, which are stacked successively. The fixed magnetization layered body 53 is formed by stacking the first fixed magnetization layer 34, the non-magnetic coupling layer 35, and the second fixed magnetization layer 56 in order from the antiferromagnetic layer 32 side.

The TMR film 91 of the second example has the same configuration as the TMR film 90 of the first example of FIG. 11 except the following points. In the TMR film 91 of the second example, the second fixed magnetization layer 56 is formed of a ferromagnetic material expressed by the general formula CoMnZ (where Z is at least one element selected from Al, Si, Ga, Ge, Cu, Mg, V, Cr, In, Sn, B, and Ni) and forming the crystal structure of a Heusler alloy with a composition of $Co_{50}Mn_{25}Z_{25}$ (in which each content is expressed in at. %). Further, in the TMR film 91, the second diffusion prevention layer 51 is provided between the second fixed magnetization layer 56 and the non-magnetic insulating layer 37a, and the first diffusion prevention layer 38 is provided between the non-magnetic insulating layer 37a and the free magnetization layer 39.

Since the second fixed magnetization layer 56 is formed of CoMnZ and has a large spin-dependent bulk scattering coefficient, the tunnel resistance change of the TMR film 91 can be greater than that of the TMR film 90 of the first example. Further, it is preferable that the second fixed magnetization layer 56 be formed of CoMnAl. Since the coercive force of the second fixed magnetization layer 56 is not limited, a CoMnAl composition having a large spin-dependent bulk scattering coefficient may be selected. In the composition of CoMnAl, the Co content is required to be 20 at. % or over in order that CoMnAl shows ferromagnetism, and the Al content is required to be 10 at. % or over in order that CoMnAl has a sufficient specific resistance.

Further, the first diffusion prevention layer 38 is provided between the non-magnetic insulating layer 37a and the free magnetization layer 39, and the second diffusion prevention layer 51 is provided between the second fixed magnetization layer 56 and the non-magnetic insulating layer 37a. Accordingly, as described in the first embodiment, it is possible to completely prevent diffusion of Mn of the free magnetization layer 39 and the second fixed magnetization layer 56. In particular, Mn becomes easily diffusible when the TMR film 91 is exposed to high temperatures in heat treatment in a magnetic field. However, it is possible to prevent diffusion of Mn with the first and second diffusion prevention layers 38 and 51.

Thus, in the TMR film 91 of the second example, the tunnel resistance change is great since the second fixed magnetization layer 56 is formed of CoMnZ, and the composition of CoMnAl of the free magnetization layer 39 is within the above-described composition range so that the free magnetization layer 39 has a low coercive force. Accordingly, it is possible to achieve a high-output magnetoresistive element having good signal magnetic field detection sensitivity.

By applying the composition and film thickness of the diffusion prevention layer 38 described in the GMR film 30 of the first example of the first embodiment, the TMR film 91 can produce the same effects as the GMR film 30.

Further, although not graphically illustrated, it is preferable to further provide a diffusion prevention layer whose material and thickness are selected from the same range of materials and range of thickness as those of the first diffusion prevention layer 38 between the free magnetization layer 39 and the protection layer 40. Depending on the material of the protection layer 40, Mn in the free magnetization layer 39 may diffuse into the protection layer 40. This reduces the magnetic moment of the free magnetization layer 39 so that the magnetoresistance change ΔRA is reduced. It is possible to avoid degradation of ΔRA by preventing diffusion of Mn by providing another diffusion prevention layer between the free magnetization layer 39 and the protection layer 40.

Next, a description is given of the TMR film of the third example forming the magnetoresistive element 20 according to the second embodiment. The TMR film of the third example is a variation of the TMR film 90 of the first example shown in FIG. 11.

FIG. 13 is a cross-sectional view of a TMR film 92 of the third example forming the magnetoresistive element 20 according to the second embodiment. In FIG. 13, the same elements as those described above are referred to by the same numerals, and a description thereof is omitted.

Referring to FIG. 13, the TMR film 92 of the third example includes the underlayer 31, the lower antiferromagnetic layer 32, the lower fixed magnetization layered body 33, the lower non-magnetic insulating layer 37a, the free magnetization layer 39, the upper non-magnetic insulating layer 67a, the upper fixed magnetization layered body 63, the upper antiferromagnetic layer 62, and the protection layer 40, which are stacked successively. That is, the TMR film 92 has a configuration where the upper non-magnetic insulating layer 67a, the upper fixed magnetization layered body 63, and the upper antiferromagnetic layer 62 are provided between the free magnetization layer 39 and the protection layer 40 of the TMR film 90 of the first example shown in FIG. 11. The TMR film 92 has a so-called dual spin-valve structure.

The lower antiferromagnetic layer 32, the lower fixed magnetization layered body 33, and the lower non-magnetic insulating layer 37a are equal in material and film thickness to the antiferromagnetic layer 32, the fixed magnetization layered body 33, and the non-magnetic insulating layer 37a, respectively, of the TMR film 90 of the first example shown in FIG. 11, and accordingly, are referred to by the same numerals. Further, the upper non-magnetic insulating layer 67a and the upper antiferromagnetic layer 62 may employ the same materials and have their film thicknesses set within the same ranges as the lower non-magnetic insulating layer 37a and the lower antiferromagnetic layer 32, respectively.

Further, the upper fixed magnetization layered body 63 has a so-called synthetic ferrimagnetic structure, where the upper second fixed magnetization layer 66, the upper non-magnetic coupling layer 65, and the upper first fixed magnetization layer 64 are stacked in order from the upper non-magnetic insulating layer 67a side. The upper first fixed magnetization layer 64, the upper non-magnetic coupling layer 65, and the upper second fixed magnetization layer 66 may employ the same materials and have their film thicknesses set within the same ranges as the lower first fixed magnetization layer 34, the lower non-magnetic coupling layer 35, and the lower second fixed magnetization layer 36, respectively.

In the TMR film 92, the CoMnAl composition of the free magnetization layer 39 is selected from the same composition range as that of the free magnetization layer 39 of the TMR film 90 of the first example shown in FIG. 11. Accordingly, the coercive force of the free magnetization layer 39 is reduced the same as in the case of the TMR film 90 of the first example. Accordingly, high output can be produced, and sensitivity to a signal magnetic field is increased.

Further, the TMR film 92 has a dual spin-valve structure. Accordingly, the tunnel resistance change of the TMR film 92 increases so as to be substantially twice the tunnel resistance change of the TMR film 90 of the first example.

Thus, the coercive force of the free magnetization layer 39 is reduced in the TMR film 92 of the third example, and the TMR film 92 can achieve a magnetoresistive element of higher output than the TMR film 90 of the first example. The method of forming the TMR film 92 is substantially the same as the method of forming the TMR film 90 of the first example, and accordingly, a description thereof is omitted.

Next, a description is given of the TMR film of the fourth example forming the magnetoresistive element 20 according to the second embodiment. The TMR film of the fourth example is a variation of the TMR film 92 of the third example shown in FIG. 13.

Figure 14:
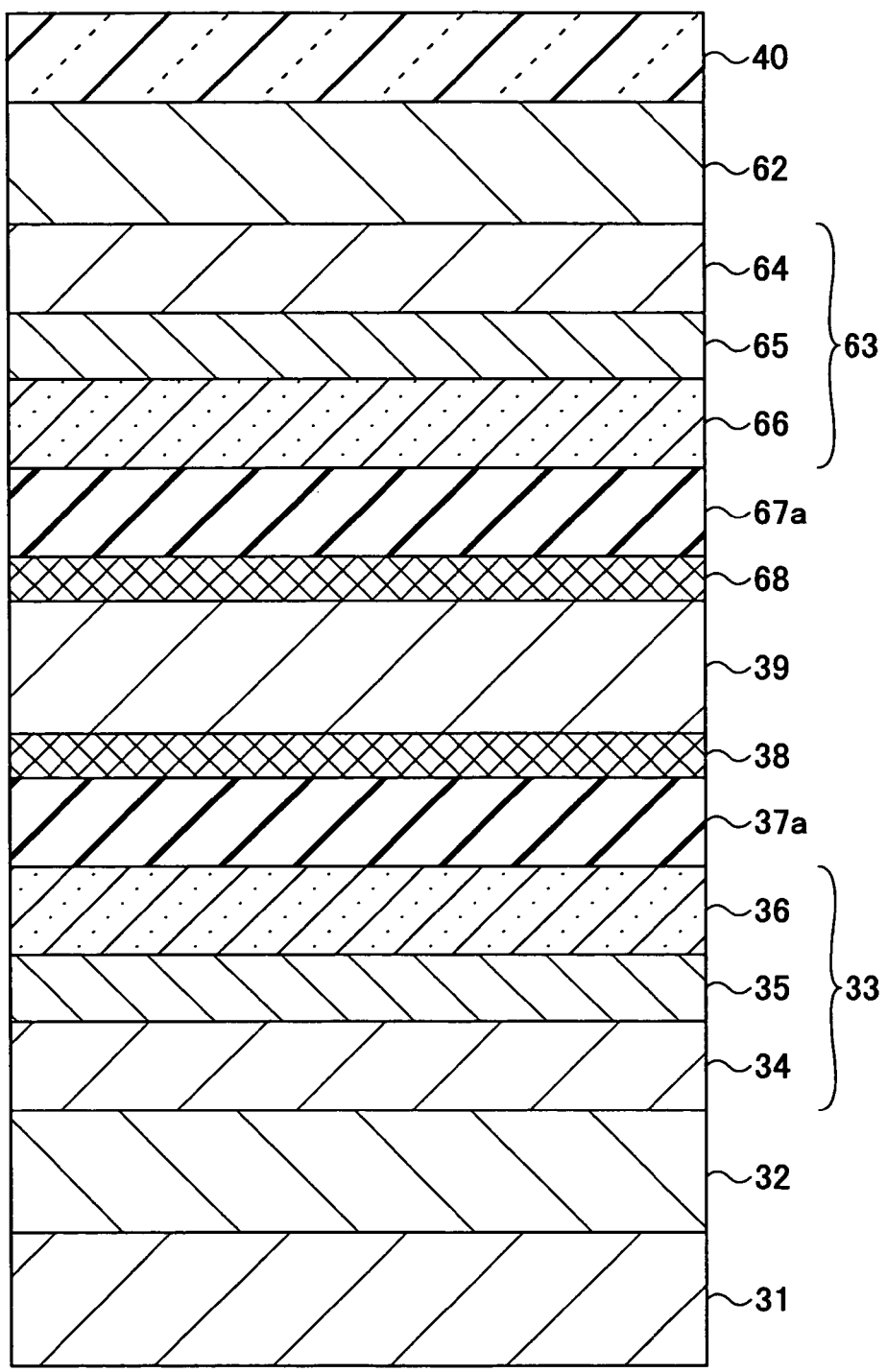
FIG. 14 is a cross-sectional view of a fourth example TMR film forming the magnetoresistive element according to the second embodiment of the present invention.

FIG. 14 is a cross-sectional view of a TMR film 93 of the fourth example forming the magnetoresistive element 20 according to the second embodiment. In FIG. 14, the same elements as those described above are referred to by the same numerals, and a description thereof is omitted.

Referring to FIG. 14, the TMR film 93 of the fourth example has the same configuration as the TMR film 92 of the third example shown in FIG. 13 except that the lower diffusion prevention layer 38 is provided between the lower non-magnetic insulating layer 37a and the free magnetization layer 39 and that the upper diffusion prevention layer 68 is provided between the free magnetization layer 39 and the upper non-magnetic insulating layer 67a.

According to the TMR film 93 of the fourth example, the material composition and the film thickness of each of the lower diffusion prevention layer 38 and the upper diffusion prevention layer 68 are selected from the same composition material range and film thickness range as the first diffusion prevention layer 38 of the TMR film 91 of the second example shown in FIG. 12. When the TMR film 93 is exposed to high temperatures in heat treatment in a magnetic field, Mn becomes easily diffusible. However, it is possible to completely prevent diffusion of Mn of the free magnetization layer 39 with the lower diffusion prevention layer 38 and the upper diffusion prevention layer 68. As a result, degradation of the tunnel resistance change is prevented.

Thus, according to the TMR film 93 of the fourth example, it is possible to prevent degradation of the tunnel resistance, and it is possible to achieve a high-output magnetoresistive element having good sensitivity to a signal magnetic field.

Next, a description is given of the TMR film of the fifth example forming the magnetoresistive element 20 according to the second embodiment. The TMR film of the fifth example is a variation of the TMR film 93 of the fourth example shown in FIG. 14.

Figure 15:
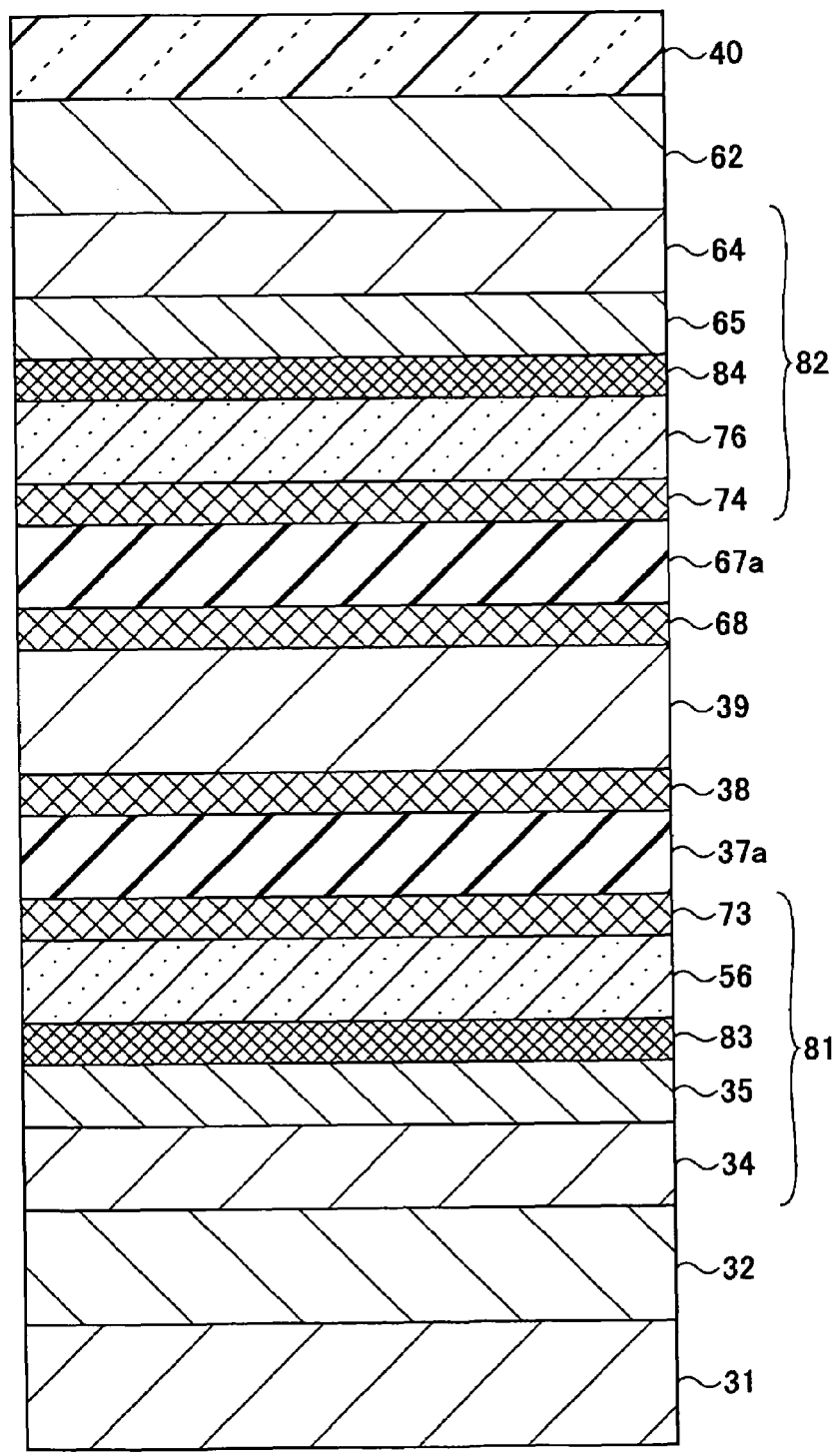
FIG. 15 is a cross-sectional view of a fifth example TMR film forming the magnetoresistive element according to the second embodiment of the present invention.

FIG. 15 is a cross-sectional view of a TMR film 94 of the fifth example forming the magnetoresistive element 20 according to the second embodiment. In FIG. 15, the same elements as those described above are referred to by the same numerals, and a description thereof is omitted.

Referring to FIG. 15, according to the TMR film 94 of the fifth example, the lower second fixed magnetization layer 56 is formed of a ferromagnetic material expressed by the general formula CoMnZ (where Z is at least one element selected from Al, Si, Ga, Ge, Cu, Mg, V, Cr, In, Sn, B, and Ni) and forming the crystal structure of a Heusler alloy with a composition of $Co_{50}Mn_{25}Z_{25}$ (in which each content is expressed in at. %), the lower interface magnetic layer 83 is provided between the lower non-magnetic coupling layer 35 and the lower second fixed magnetization layer 56, and the lower second diffusion prevention layer 73 is provided between the lower second fixed magnetization layer 56 and the lower non-magnetic insulating layer 37a. Further, in the TMR film 94, the upper second fixed magnetization layer 76 is formed of a ferromagnetic material expressed by the general formula CoMnZ (where Z is at least one element selected from Al, Si, Ga, Ge, Cu, Mg, V, Cr, In, Sn, B, and Ni) and forming the crystal structure of a Heusler alloy with a composition of $Co_{50}Mn_{25}Z_{25}$ (in which each content is expressed in at. %), the upper second diffusion prevention layer 74 is provided between the upper non-magnetic insulating layer 67a and the upper second fixed magnetization layer 66, and the upper interface magnetic layer 84 is provided between the upper second fixed magnetization layer 66 and the upper non-magnetic coupling layer 65. The TMR film 94 is equal to the TMR film 93 of the fourth example shown in FIG. 14 in the other aspects of configuration.

Since each of the lower second fixed magnetization layer 56 and the upper second fixed magnetization layer 66 is formed of CoMnZ, the tunnel resistance change is great. Further, CoMnAl of the free magnetization layer 39 is set within the above-described predetermined composition range so that the coercive force of thee free magnetization layer 39 is low. Accordingly, it is possible to achieve a high-output magnetoresistive element having good signal magnetic field detection sensitivity.

Further, by providing the lower second diffusion prevention layer 73 and the upper second diffusion prevention layer 74, it is possible to completely prevent diffusion of Mn of the lower second fixed magnetization layer 56 and the upper second fixed magnetization layer 76.

Further, the same material and film thickness of the lower interface magnetic layer 83 of the GMR film 80 of the fifth example of the first embodiment are selected for the lower interface magnetic layer 83 of the TMR film 94. Further, the same material and film thickness of the upper interface magnetic layer 84 of the GMR film 80 of the fifth example of the first embodiment are selected for the upper interface magnetic layer 84 of the TMR film 94. Accordingly, it is possible to increase the tunnel resistance change.

Thus, the TMR film 94 of the fifth example further increases the tunnel resistance change compared with the TMR film 93 of the fourth example. Accordingly, it is possible to achieve a magnetoresistive element of higher output with better sensitivity to a signal magnetic field.

Third Embodiment

Figure 16:
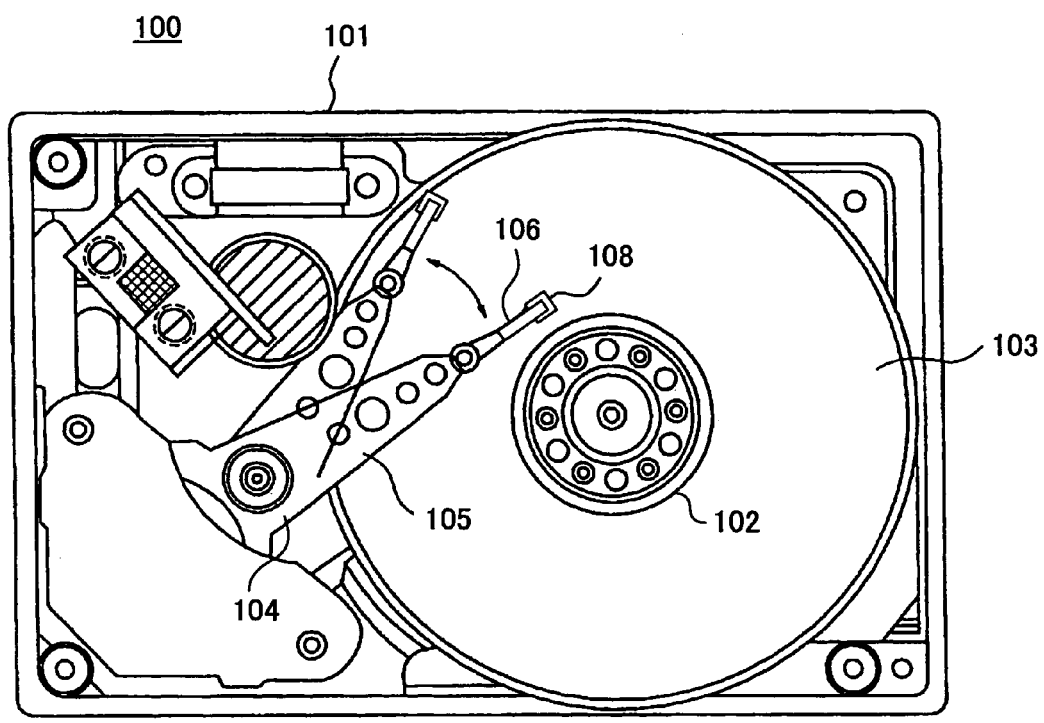
FIG. 16 is a partial plan view of a magnetic storage unit according to a third embodiment of the present invention.

FIG. 16 is a partial plan view of a magnetic storage unit 100 according to a third embodiment of the present invention.

Referring to FIG. 16, the magnetic storage unit 100 includes a housing 101. In the housing 101, a hub 102 driven by a spindle (not graphically illustrated), a magnetic recording medium 103 fixed to the hub 102 and rotated by the spindle, an actuator unit 104, an arm 105 and a suspension 106 supported by the actuator unit 104 so as to be driven in the radial directions of the magnetic recording medium 103, and a magnetic head 108 supported by the suspension 106 are provided.

The magnetic recording medium 103 may be of either a longitudinal magnetic recording type or a perpendicular magnetic recording type. Alternatively, the magnetic recording medium 103 may have oblique anisotropy. Further, the magnetic recording medium 103 is not limited to a magnetic disk, and may be a magnetic tape.

The magnetic head 108 includes the magnetoresistive element 20 formed on the ceramic substrate 11 and the induction-type recording element 13 formed thereon as shown in FIG. 1. The induction-type recording element 13 may be a ring-type recording element for longitudinal magnetic recording, a magnetic monopole head for perpendicular magnetic recording, or any other known recording element. The magnetoresistive element 20 includes the GMR film of any of the first through fifth examples of the first embodiment or the TMR film of any of the first through fifth embodiments of the second embodiment. Accordingly, the magnetoresistive element 20 produces high output and has good sensitivity to a signal magnetic field. Accordingly, the magnetic storage unit 100 is suitable for high density recording. The basic configuration of the magnetic storage unit 100 according to this embodiment is not limited to the configuration shown in FIG. 16.

Fourth Embodiment

Figure 17A:
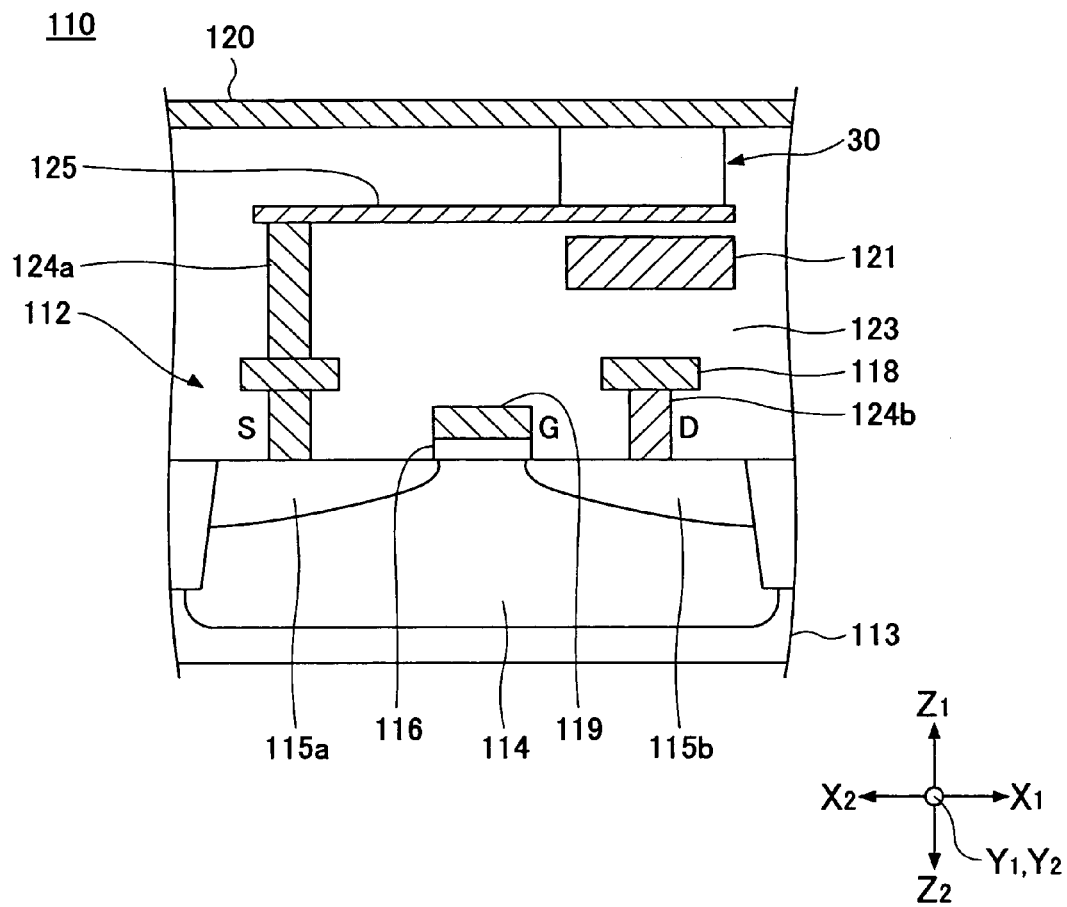
FIG. 17A is a cross-sectional view of a magnetic memory unit of a first example according to a fourth embodiment of the present invention.
Figure 17B:
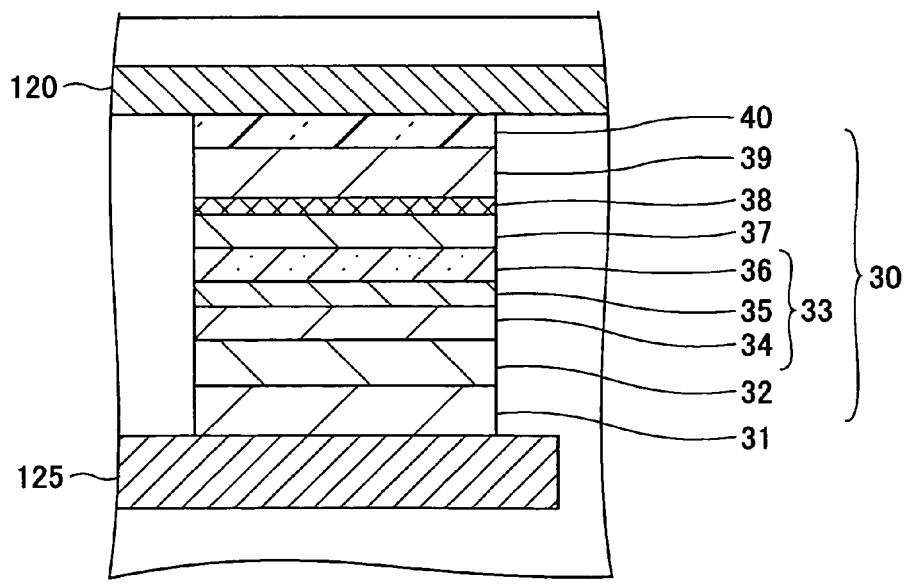
FIG. 17B is a schematic diagram showing a configuration of the GMR film shown in FIG. 17A according to the fourth embodiment of the present invention.
Figure 18:
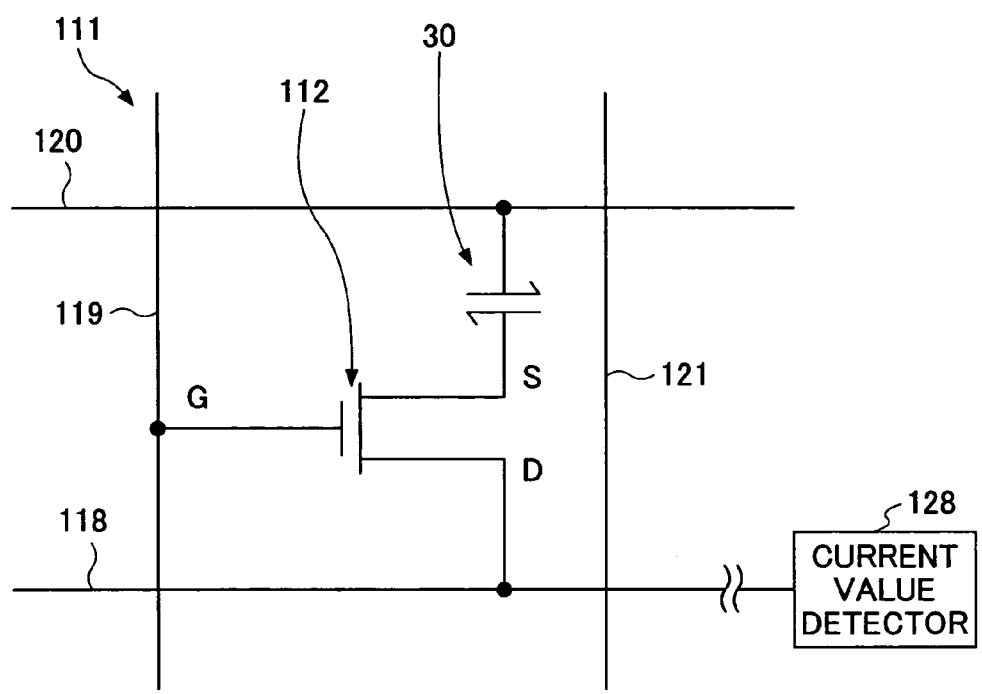
FIG. 18 is an equivalent circuit diagram of a memory cell of the magnetic memory unit of the first example according to the fourth embodiment of the present invention.

FIG. 17A is a cross-sectional view of a magnetic memory unit 110 of a first example according to a fourth embodiment of the present invention. FIG. 17B is a schematic diagram showing a configuration of the GMR film 30 shown in FIG. 17A. FIG. 18 is an equivalent circuit diagram of a memory cell 111 of the magnetic memory unit 110. In FIG. 17A, orthogonal coordinate axes are also shown in order to indicate directions. Of those, the $Y_1$ and $Y_2$ directions are perpendicular to the plane of the paper (X-Z plane) with the $Y_1$ direction going into the plane of the paper and the $Y_2$ direction coming out of the plane of the paper. In the following description, if a direction is merely referred to as, for example, "X direction", the direction may be either the $X_1$ or $X_2$ direction. The same applies to "Y direction" and "Z direction." In the drawings, the same elements as those described above are referred to by the same numerals, and a description thereof is omitted.

Referring to FIGS. 17A, 17B, and 18, the magnetic memory unit 110 includes the multiple memory cells 111 arranged in a matrix manner, for example: Each memory cell 111 includes a magnetoresistive film (the GMR film 30) and a metal-oxide-semiconductor field effect transistor (MOSFET) 112. A p-channel MOSFET or an n-channel MOSFET may be used for the MOSFET 112. Here, a description is given taking an n-channel MOSFET, in which electrons serve as carriers, as an example.

The MOSFET 112 has a p-well region 114 containing a p-type impurity formed in a silicon substrate 113, and impurity diffusion regions 115a and 115b formed in the vicinity of the surface of the silicon substrate 113 in the p-well region 114 so as to be separate from each other. N-type impurity is introduced into the impurity diffusion regions 115a and 115b. Here, the impurity diffusion region 115a serves as a source S, and the other impurity diffusion region 115b serves as a drain D. The MOSFET 112 has a gate electrode G formed on a gate insulating film 116 on the surface of the silicon substrate 113 between the two impurity diffusion regions 115a and 115b.

The source S of the MOSFET 112 is electrically connected to one side of the GMR film 30, for example, the underlayer 31, through a vertical interconnection 124a and an in-layer interconnection 125. Further, a plate line 118 is electrically connected to the drain D through a vertical interconnection 124b. A word line 119 for reading is electrically connected to the gate electrode G. Alternatively, the gate electrode G may also serve as the word line 119 for reading.

Further, a bit line 120 is electrically connected to the other side of the GMR film, for example, the protection film 40. A word line 121 for writing is provided below the GMR film 30 in isolation therefrom.

The GMR film 30 has the same configuration as shown in FIG. 2. In the GMR film 30, the magnetocrystalline easy axis and the magnetocrystalline hard axis of the free magnetization layer 39 are oriented along the X-axis and Y-axis, respectively, shown in FIG. 17A. The directions of the magnetocrystalline easy axis may be formed either by heat treatment or through shape anisotropy. In the case of forming the magnetocrystalline easy axis in the X-axial directions through shape anisotropy, the shape of a cross section of the GMR film 30 parallel to its film surface (or parallel to the X-Y plane) is caused to be a rectangle having a longer side in the X direction than in the Y direction.

In the magnetic memory unit 110, the surface of the silicon substrate 113 and the gate electrode G are covered with an interlayer insulating film 123 such as a silicon nitride film or a silicon oxide film. The GMR film 30, the plate line 118, the word line 119 for reading, the bit line 120, the word line 121 for writing, the vertical interconnections 124a and 124b, and the in-layer interconnection 125 have the above-described electrical connections, but otherwise they are electrically isolated from one another by the interlayer insulating film 123.

The magnetic memory unit 110 retains information in the GMR film 30. Information is retained based on whether the direction of magnetization of the free magnetization layer 39 is parallel to or antiparallel to the direction of magnetization of the second fixed magnetization layer 36.

Next, a description is given of a write operation and a read operation of the magnetic memory unit 110. The operation of the magnetic memory unit 110 to write information into the GMR film 30 is performed by the bit line 120 and the word line 121 for writing disposed on and below the GMR film 30, respectively. The bit line 120 extends in the X direction on the GMR film 30. By causing current to flow through the bit line 120, a magnetic field is applied to the GMR film 30 in the Y direction. The word line 121 for writing extends in the Y direction below the GMR film 30. By causing current to flow through the word line 121 for writing, a magnetic field is applied to the GMR film 30 in the X direction.

The magnetization of the free magnetization layer 39 of the GMR film 30 is oriented in the X direction (for example, the $X_2$ direction) when substantially no magnetic field is applied. The direction of the magnetization is stable.

In the case of writing information into the GMR film 30, current is caused to flow through the bit line 120 and the word line 121 for writing at the same time. For example, in the case of orienting the magnetization of the free magnetization layer 39 in the $X_1$ direction, the current is caused to flow through the word line 121 for writing in the $Y_1$ direction. As a result, the magnetic field is in the $X_1$ direction in the GMR film 30. At this point, the direction of the current caused to flow through the bit line 120 may be either the $X_1$ direction or the $X_2$ direction. The magnetic field generated by the current flowing through the bit line 120 is in the $Y_1$ direction or the $Y_2$ direction in the GMR film 30, and functions as part of the magnetic field for the magnetization of the free magnetization layer 39 crossing the barrier of the magnetocrystalline hard axis. That is, as a result of simultaneous application of the magnetic field in the $X_1$ direction and the magnetic field in the $Y_1$ or $Y_2$ direction to the magnetization of the free magnetization layer 39, the magnetization of the free magnetization layer 39 oriented in the $X_2$ direction is reversed to be in the $X_1$ direction. After the magnetic fields are removed, the magnetization of the free magnetization layer 39 remains oriented in the $X_1$ direction, and is stable unless the magnetic fields of the next write operation or magnetic fields for erasure are applied.

Thus, "1" or "0" can be recorded in the GMR film 30 depending on the direction of the magnetization of the free magnetization layer 39. For example, when the direction of magnetization of the second fixed magnetization layer 36 is the $X_1$ direction, "1" is recorded if the direction of magnetization of the free magnetization layer 39 is the $X_1$ direction (the state of low tunnel resistance) and "0" is recorded if the direction of magnetization of the free magnetization layer 39 is the $X_2$ direction (the state of high tunnel resistance).

The magnitude of each of the currents supplied to the bit line 120 and the word line 121 for writing at the time of the write operation is such that a flow of current through one of the bit line 120 and the word line 121 alone does not reverse the magnetization of the free magnetization layer 39. As a result, recording is performed only in the magnetization of the free magnetization layer 39 of the GMR film 30 at the intersection of the bit line 120 supplied with current and the word line 121 for writing supplied with current. The impedance on the source S side is high so as to prevent current from flowing through the GMR film 30 at the time of causing current to flow through the bit line 120 in the write operation.

Meanwhile, the operation of the magnetic memory unit 110 to read out information from the GMR film 30 is performed by applying to the bit line 120 a negative voltage relative to the source S and applying a voltage higher than the threshold voltage of the MOSFET 112 (a positive voltage) to the word line 119 for reading, that is, the gate electrode G. As a result, the MOSFET 112 turns ON so that electrons flow from the bit line 120 to the plate line 118 through the GMR film 30, the source S, and the drain D. By electrically connecting a current value detector 128 such as an ammeter to the plate line 118, a magnetoresistance value corresponding to the direction of magnetization of the free magnetization layer 39 relative to the direction of magnetization of the second fixed magnetization layer 36 is detected. Thereby, it is possible to read out the information of "1" or "0" retained by the GMR film 30.

According to the magnetic memory unit 110 of the first example according to the fourth embodiment of the present invention, the free magnetization layer 39 of the GMR film 30 is formed of CoMnAl, so that the magnetoresistance change $\Delta RA$ is great. Therefore, according to the magnetic memory unit 110, there is a great difference between the magnetoresistance values corresponding to retained "0" and "1," respectively, at the time of reading out information, so that it is possible to perform reading with accuracy. Further, as described above in the first embodiment, in the GMR film 30, the coercive force of the free magnetization layer 39 is reduced by selecting the composition of CoMnAl of the free magnetization layer 39 within a predetermined range. Therefore, according to the magnetic memory unit 110, it is possible to reduce an applied magnetic field in the write operation, so that it is possible to reduce current caused to flow through the bit line 120 and the word line 121 for writing in the write operation. Therefore, according to the magnetic memory unit 110, it is possible to reduce power consumption.

Further, the GMR film 30 has the diffusion prevention layer 38 provided between the non-magnetic metal layer 37 and the free magnetization layer 39. Therefore, Mn contained in the free magnetization layer 39 is prevented from diffusing into the non-magnetic metal layer 37. Therefore, it is possible to prevent degradation of $\Delta RA$ of the GMR film 30. In particular, by using CoNiFe for the diffusion prevention layer 38, it is possible to achieve an increase in $\Delta RA$ and a decrease in the coercive force of the multilayer body of the free magnetization layer 39 and the diffusion prevention layer 38 simultaneously. As a result, according to the magnetic memory unit 110, it is possible to reduce an applied magnetic field in the write operation. Accordingly, it is possible to reduce current caused to flow through the bit line 120 and the word line 121 for writing in the write operation. Therefore, according to the magnetic memory unit 110, it is possible to reduce power consumption.

The GMR film 30 of the magnetic memory unit 110 may be replaced by any of the GMR films 50, 60, 70, and 80 of the second, third, fourth, and fifth examples of the first embodiment shown in FIGS. 3, 4, 5, and 6, respectively. Further, any of the above-described variations of the GMR films 50, 60, 70, and 80 of the second, third, fourth, and fifth examples may also be employed.

Figure 19:
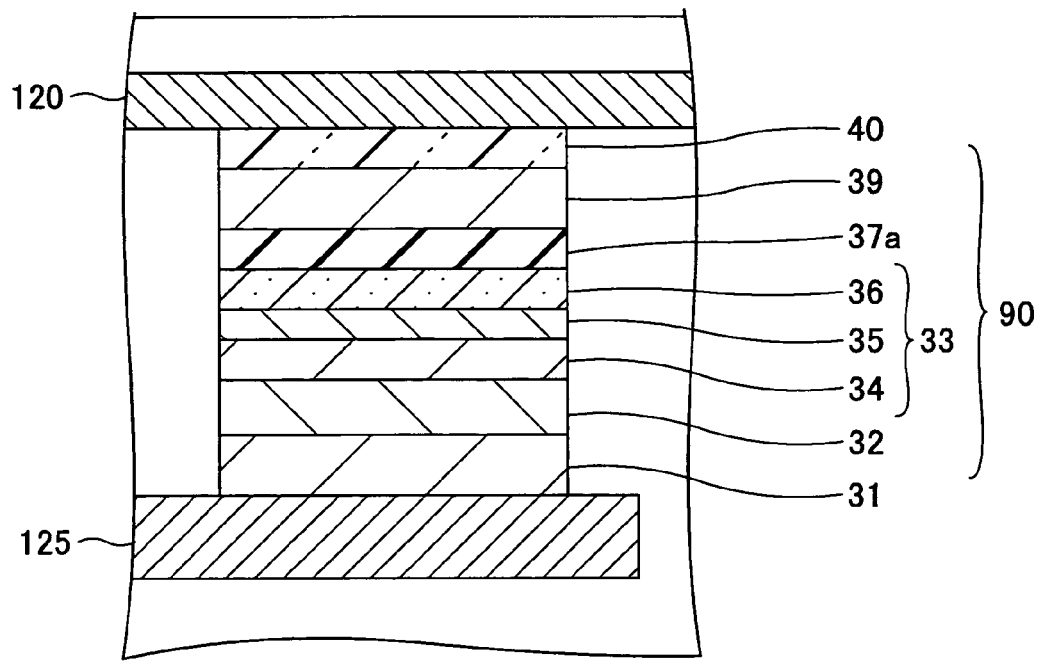
FIG. 19 is a diagram showing a configuration of the TMR film forming a variation of the magnetic memory unit of the first example according to the fourth embodiment of the present invention.

FIG. 19 is a diagram showing a configuration of the TMR film 90 forming a variation of the magnetic memory unit 110 of the first example according to the fourth embodiment. Referring to FIG. 19 together with FIG. 17A, the GMR film 30 of the magnetic memory unit 110 may also be replaced by the TMR film 90. The TMR film 90 has the same configuration as the TMR film of the first example forming the magnetoresistive element 20 according to the second embodiment shown in FIG. 11. According to the TMR film 90, for example, the underlayer 31 is in contact with the in-layer interconnection 125, and the protection film 40 is in contact with the bit line 120. Further, the magnetocrystalline easy axis of the free magnetization layer 39 is disposed in the same manner as in the above-described GMR film 30. The write operation and the read operation of the magnetic memory unit 110 in the case of employing the TMR film 90 are the same as in the case of employing the GMR film 30, and accordingly, a description thereof is omitted.

As described in the second embodiment, the TMR film 90 produces the tunnel effect. In the TMR film 90, the tunnel resistance change is great since the free magnetization layer 39 is formed of CoMnAl. Therefore, according to the magnetic memory unit 110, there is a great difference between the tunnel resistance values corresponding to retained "0" and "1" at the time of reading out information, so that it is possible to perform reading with accuracy. Further, since the coercive force of the free magnetization layer 39 is reduced, the sensitivity of the TMR film 90 is high. Therefore, according to the magnetic memory unit 110, it is possible to reduce power consumption.

The TMR film 90 of the magnetic memory unit 110 may be replaced by any of the TMR films 91 through 94 of the second through fifth examples of the second embodiment shown in FIGS. 12 through 15, respectively. Further, any of the above-described variations of the TMR films 91 through 94 of the second through fifth examples may also be employed.

Figure 20:
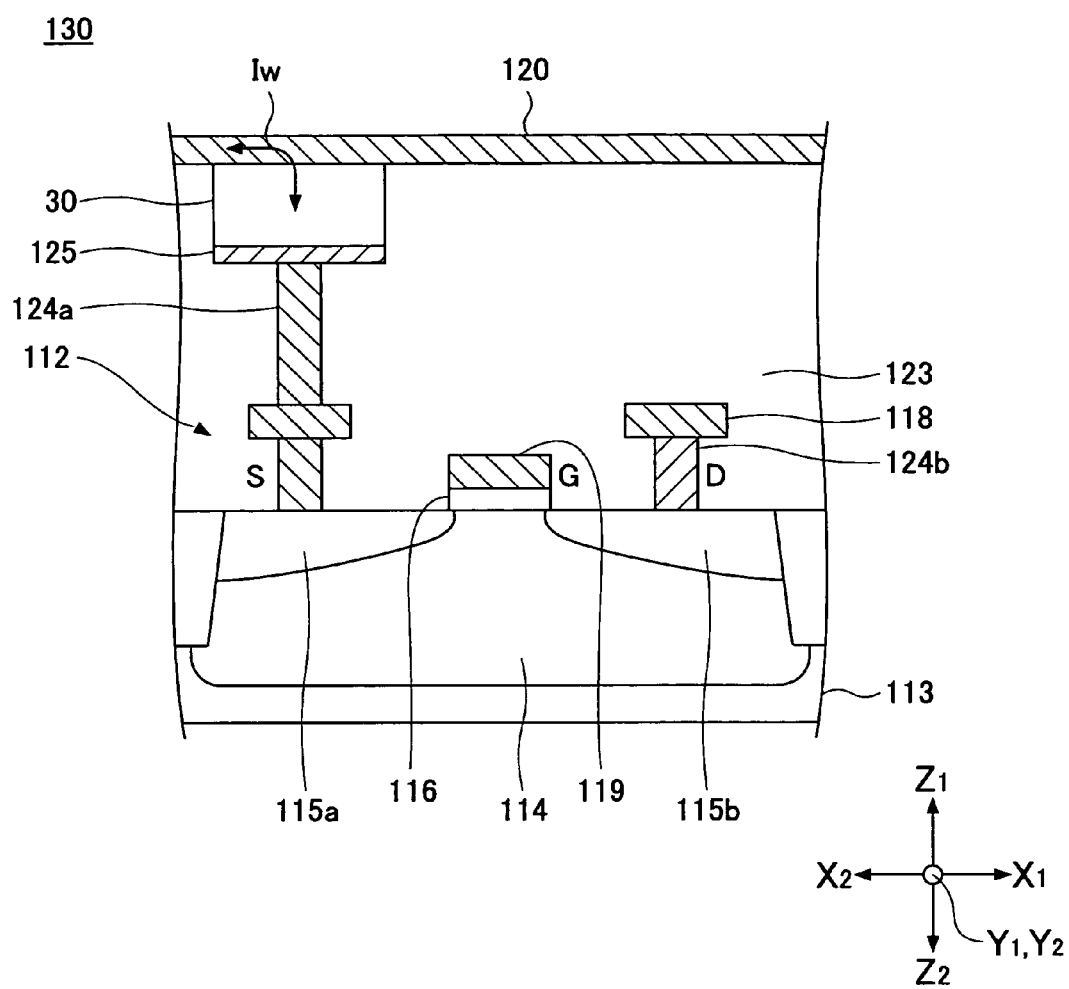
FIG. 20 is a cross-sectional view of a magnetic memory unit of a second example according to the fourth embodiment of the present invention.

FIG. 20 is a cross-sectional view of a magnetic memory unit 130 of a second example according to the fourth embodiment of the present invention. In FIG. 20, the same elements as those described above are referred to by the same numerals, and a description thereof is omitted.

Referring to FIG. 20, the magnetic memory unit 130 has a mechanism for writing information into the GMR film 30 different from that of the magnetic memory unit 110 of the first example. Each memory cell of the magnetic memory unit 130 has the same configuration as the memory cell 111 shown in FIGS. 17A and 17B except that no word line 121 for writing is provided. A description is given below of the magnetic memory unit 130 with reference to FIG. 20 together with FIG. 17B.

The write operation of the magnetic memory unit 130 is different from that of the magnetic memory unit 110 of the first example. According to the magnetic memory unit 130, a spin-polarized current Iw is injected into the GMR film 30, and the direction of magnetization of the free magnetization layer 39 is reversed (or switched), depending on the direction of the injected current Iw, from the parallel state to the antiparallel state or from the antiparallel state to the parallel state relative to the direction of magnetization of the second fixed magnetization layer 36. The spin-polarized current Iw is a flow of electrons of one of the two spin directions that the electrons can take. By causing the spin-polarized current Iw to flow through the GMR film 30 in the upward ($Z_1$) or downward ($Z_2$) direction, a torque is generated in the magnetization of the free magnetization layer 39 so as to cause so-called spin transfer magnetization switching (reversal). The amount of current of the spin-polarized current Iw, which is suitably selected in accordance with the film thickness of the free magnetization layer 39, is approximately a few mA to 20 mA. The spin-polarized current Iw is smaller in amount than the current caused to flow through the bit line 120 and the word line 121 for writing in the write operation of the magnetic memory unit 110 of the first example shown in FIG. 17A. Therefore, according to the magnetic memory unit 130, it is possible to further reduce power consumption.

It is possible to generate a spin-polarized current by causing current to flow perpendicularly through a multilayer body having substantially the same configuration as the GMR film 30 with two ferromagnetic layers and a Cu film sandwiched therebetween. The spin direction of electrons can be controlled by causing the directions of magnetization of the two ferromagnetic layers to be parallel or antiparallel to each other. The read operation of the magnetic memory unit 130 is the same as that of the magnetic memory unit 110 of the first example shown in FIG. 17A.

The magnetic memory unit 130 of the second example produces the same effects as the magnetic memory unit 110 of the first example. Further, the amount of current in the write operation can be smaller in the magnetic memory unit 130 of the second example than in the magnetic memory unit 110 of the first example. Therefore, according to the magnetic memory unit 130 of the second example, it is possible to further reduce power consumption.

The GMR film 30 of the magnetic memory unit 130 may be replaced by any of the GMR films 50, 60, 70, and 80 of the second, third, fourth, and fifth examples of the first embodiment shown in FIGS. 3, 4, 5, and 6, respectively. Alternatively, the GMR film 30 of the magnetic memory unit 130 may be replaced by any of the TMR films 90 through 94 of the first through fifth examples of the second embodiment shown in FIGS. 11 through 15, respectively.

Further, in the magnetic memory unit 110 of the first example and the magnetic memory unit 130 of the second example of the fourth embodiment, current control in the write operation and read operation is performed by the MOSFET 112. Alternatively, this current control may be performed by any other known method.

According to one aspect of the present invention, CoMnAl is employed for the free magnetization layer of a CPP magnetoresistive element. CoMnAl has a relatively large spin-dependent bulk scattering coefficient substantially equal to that of CoFe, which is conventionally employed as the material of the free magnetization layer. Further, the specific resistance of CoMnAl is extremely greater than the specific resistance of CoFe. Accordingly, employment of CoMnAl for the free magnetization layer and/or a fixed magnetization layer makes the magnetoresistance change depending on the product of the spin-dependent bulk scattering coefficient and the specific resistance extremely greater than that in the case of employing CoFe. As a result, it is possible to significantly increase the output of the magnetoresistive element. Further, according to one aspect of the present invention, a diffusion prevention layer to prevent Mn included in the free magnetization layer from diffusing into a non-magnetic metal layer is provided between the non-magnetic metal layer and the free magnetization layer. Existence of Mn in the non-magnetic metal layer will cause the fixed magnetization layer and the free magnetization layer to be coupled magnetically with the same magnetization direction, so that the magnetization of the fixed magnetization layer and the magnetization of the free magnetization layer may move at the same angle to an external magnetic field. Provision of the diffusion prevention layer prevents diffusion of Mn into the non-magnetic metal layer, thereby preventing degradation of ΔRA, which is caused by diffusion of Mn into the non-magnetic metal layer.

Further, the studies by the inventors of the present invention have found that selecting the composition of CoMnAl of the free magnetization layer from those within the above described area ABCDEFA makes it possible to make the coercive force of the free magnetization layer lower than that in the case of the Heusler alloy composition of $Co_{50}Mn_{25}Al_{25}$. As a result of these, the sensitivity to a signal magnetic field from a magnetic recording medium increases, so that it is possible to cope with reduction in the signal magnetic field from the magnetic recording medium due to high recording density. Therefore, according to the present invention, it is possible to achieve a high-output magnetoresistive element having good sensitivity for detecting a magnetic field. The CPP type refers to the method by which sense current is caused to flow in a direction perpendicular to the film surface of a magnetoresistive film, that is, in the stacking direction of the layers of the magnetoresistive film.

According to one aspect of the present invention, by employing CoMnAl of the above-described composition range for the free magnetization layer, it is also possible to achieve a high-output magnetoresistive element having good sensitivity to a signal magnetic field in the case where a magnetoresistive element includes a so-called tunneling magnetoresistive film.

According to one aspect of the present invention, since a magnetoresistive element produces high output and has good sensitivity to a signal magnetic field, it is possible to achieve a magnetic head capable of supporting recording and reproduction with high recording density.

According to one aspect of the present invention, since a magnetoresistive element produces high output and has good sensitivity to a signal magnetic field from a magnetic recording medium, it is possible to provide a magnetic storage unit with high recording density.

According to one aspect of the present invention, CoMnAl is employed for a free magnetization layer in a magnetic memory unit. Therefore, the magnetoresistance change depending on the product of the spin-dependent bulk scattering coefficient and the specific resistance is extremely greater than that in the case of employing CoFe. Accordingly, there is a great difference between the magnetoresistance values corresponding to retained "0" and "1," respectively, so that the magnetic memory unit is capable of performing reading with accuracy at the time of reading out information. Further, a diffusion prevention layer to prevent Mn contained in the free magnetization layer from diffusing into a non-magnetic metal layer is provided between the non-magnetic metal layer and the free magnetization layer. The diffusion prevention layer makes it possible to prevent Mn diffusion into the non-magnetic metal layer due to temperature increase caused by heat treatment in the manufacturing process of a magnetic memory unit or by heat generation during use of the magnetic memory unit. Therefore, the magnetic memory unit has good heat resistance and can prevent degradation of the magnetoresistance change.

According to one aspect of the present invention, even in the case where the magnetoresistive film is a tunneling magnetoresistive film, it is possible to realize a magnetic memory unit capable of performing reading with accuracy by using CoMnAl of the above-described composition range for a free magnetization layer.

Thus, according to one aspect of the present invention, it is possible to achieve a high-output magnetoresistive element with good sensitivity for detecting a magnetic field, and a magnetic head and a magnetic storage unit using the same.

The present invention is not limited to the specifically disclosed embodiments, and variations and modifications may be made without departing from the scope of the present invention.

For example, in the third embodiment, a description is given of the case of a disk magnetic recording medium. However, the present invention may also be applied to a magnetic tape unit including a tape magnetic recording medium. Further, a description is given above of the magnetic head including a magnetoresistive element and a recording element by way of example. However, the present invention may also be applied to a magnetic head including only a magnetoresistive element and a magnetic head including multiple magnetoresistive elements.

What is claimed is:

1. A magnetoresistive element of a CPP type, comprising:
   a fixed magnetization layer, a non-magnetic metal layer, and a free magnetization layer that are stacked; and
   a diffusion prevention layer,
   wherein:
   the free magnetization layer includes CoMnAl;
   the diffusion prevention layer is provided between the non-magnetic metal layer and the free magnetization layer so as to prevent Mn included in the free magnetization layer from diffusing into the non-magnetic metal layer; and
   said CoMnAl has a composition within an area formed by connecting a first point (44, 23, 33), a second point (48, 25, 27), a third point (60, 20, 20), a fourth point (65, 15, 20), a fifth point (65, 10, 25), a sixth point (60, 10, 30), and the first point with straight lines in this order in a ternary composition diagram where coordinates of the composition are expressed as (Co content, Mn content, Al content) with each of the Co content, the Mn content, and the Al content being expressed in atomic percentage.

2. The magnetoresistive element as claimed in claim 1, wherein the diffusion prevention layer comprises a ferromagnetic material containing at least one element selected from the group consisting of Co, Fe, and Ni, the ferromagnetic material being free of Mn.

3. The magnetoresistive element as claimed in claim 1, further comprising:
   an additional diffusion prevention layer and a protection film stacked in this order on the free magnetization layer, wherein the additional diffusion prevention layer comprises a ferromagnetic material containing at least one element selected from the group consisting of Co, Fe, and Ni, the ferromagnetic material being free of Mn.

4. The magnetoresistive element as claimed in claim 1, further comprising:
   a first additional diffusion prevention layer, an additional non-magnetic metal layer, and an additional fixed magnetization layer stacked on the free magnetization layer.

5. The magnetoresistive element as claimed in claim 4, wherein:
   the additional fixed magnetization layer comprises a second fixed magnetization layer, a non-magnetic coupling layer, and a first fixed magnetization layer stacked in this order;
   a second additional diffusion prevention layer is provided between the second fixed magnetization layer and the additional non-magnetic metal layer; and
   the second fixed magnetization layer comprises CoMnZ where Z is at least one element selected from the group consisting of Al, Si, Ga, Ge, Cu, Mg, V, Cr, In, Sn, B, and Ni.

6. The magnetoresistive element as claimed in claim 5, further comprising:
   a third additional diffusion prevention layer between the second fixed magnetization layer and the non-magnetic coupling layer.

7. The magnetoresistive element as claimed in claim 1, wherein:
   the fixed magnetization layer comprises a first fixed magnetization layer, a non-magnetic coupling layer, and a second fixed magnetization layer stacked in this order;
   a first additional diffusion prevention layer is provided between the second fixed magnetization layer and the non-magnetic metal layer; and
   the second fixed magnetization layer comprises CoMnZ where Z is at least one element selected from the group consisting of Al, Si, Ga, Ge, Cu, Mg, V, Cr, In, Sn, B, and Ni.

8. The magnetoresistive element as claimed in claim 7, further comprising:
   a second additional diffusion prevention layer between the non-magnetic coupling layer and the second fixed magnetization layer.

9. A magnetic head, comprising:
   the magnetoresistive element as set forth in claim 1.

10. A magnetic storage unit, comprising:
    a magnetic head including the magnetoresistive element as set forth in claim 1; and
    a magnetic recording medium.

11. A magnetoresistive element of a CPP type, comprising:
    a fixed magnetization layer, a non-magnetic insulating layer, and a free magnetization layer that are stacked,
    wherein:
    the free magnetization layer comprises CoMnAl; and
    said CoMnAl has a composition within an area formed by connecting a first point (44, 23, 33), a second point (48, 25, 27), a third point (60, 20, 20), a fourth point (65, 15, 20), a fifth point (65, 10, 25), a sixth point (60, 10, 30), and the first point with straight lines in this order in a ternary composition diagram where coordinates of the composition are expressed as (Co content, Mn content, Al content) with each of the Co content, the Mn content, and the Al content being expressed in atomic percentage.

12. The magnetoresistive element as claimed in claim 11, further comprising:

a first diffusion prevention layer between the non-magnetic insulating layer and the free magnetization layer; and a second additional diffusion prevention layer and a protection film stacked in this order on the free magnetization layer, wherein the first diffusion prevention layer includes a ferromagnetic material containing at least one element selected from the group consisting of Co, Fe, and Ni, the ferromagnetic material being free of Mn; and the second diffusion prevention layer includes a ferromagnetic material containing at least one element selected from the group consisting of Co, Fe, and Ni, the ferromagnetic material being free of Mn.

13. A magnetic head, comprising:
the magnetoresistive element as set forth in claim 11.

14. A magnetic storage unit, comprising:
a magnetic head including the magnetoresistive element as set forth in claim 11; and
a magnetic recording medium.

15. A magnetic memory unit, comprising:
a magnetoresistive film of a CPP type including a fixed magnetization layer, a non-magnetic metal layer, and a free magnetization layer that are stacked, and a diffusion prevention layer;
a write part configured to orient magnetization of the free magnetization layer in a predetermined direction by applying a magnetic field to the magnetoresistive film; and
a read part configured to detect resistance by supplying a sense current to the magnetoresistive film,
wherein:
the free magnetization layer includes CoMnAl;
the diffusion prevention layer is provided between the non-magnetic metal layer and the free magnetization layer so as to prevent Mn included in the free magnetization layer from diffusing into the non-magnetic metal layer; and
said CoMnAl has a composition within an area formed by connecting a first point (44, 23, 33), a second point (48, 25, 27), a third point (60, 20, 20), a fourth point (65, 15, 20), a fifth point (65, 10, 25), a sixth point (60, 10, 30), and the first point with straight lines in this order in a ternary composition diagram where coordinates of the composition are expressed as (Co content, Mn content, Al content) with each of the Co content, the Mn content, and the Al content being expressed in atomic percentage.

16. The magnetic memory unit as claimed in claim 15, wherein the write part controls orientation of the magnetization of the free magnetization layer by applying a first magnetic field substantially parallel to a film surface of the magnetoresistive film in a direction of a magnetocrystalline easy axis of the free magnetization layer and a second magnetic field in a direction substantially parallel to the film surface and at a predetermined angle with the first magnetic field.

17. The magnetic memory unit as claimed in claim 15, wherein the write part controls orientation of the magnetization of the free magnetization layer by supplying an electron flow having polarized spin to the magnetoresistive element.

18. A magnetic memory unit, comprising:
a magnetoresistive film of a CPP type including a fixed magnetization layer, a non-magnetic insulating layer, and a free magnetization layer that are stacked;
a write part configured to orient magnetization of the free magnetization layer in a predetermined direction by applying a magnetic field to the magnetoresistive film; and
a read part configured to detect resistance by supplying a sense current to the magnetoresistive film,
wherein:
the free magnetization layer includes CoMnAl; and
said CoMnAl has a composition within an area formed by connecting a first point (44, 23, 33), a second point (48, 25, 27), a third point (60, 20, 20), a fourth point (65, 15, 20), a fifth point (65, 10, 25), a sixth point (60, 10, 30), and the first point with straight lines in this order in a ternary composition diagram where coordinates of the composition are expressed as (Co content, Mn content, Al content) with each of the Co content, the Mn content, and the Al content being expressed in atomic percentage.

19. The magnetic memory unit as claimed in claim 18, wherein the write part controls orientation of the magnetization of the free magnetization layer by applying a first magnetic field substantially parallel to a film surface of the magnetoresistive film in a direction of a magnetocrystalline easy axis of the free magnetization layer and a second magnetic field in a direction substantially parallel to the film surface and at a predetermined angle with the first magnetic field.

20. The magnetic memory unit as claimed in claim 18, wherein the write part controls orientation of the magnetization of the free magnetization layer by supplying an electron flow having polarized spin to the magnetoresistive element.

* * * * *